United States Patent
Yu et al.

(10) Patent No.: US 9,418,978 B2
(45) Date of Patent: Aug. 16, 2016

(54) METHOD OF FORMING PACKAGE-ON-PACKAGE (POP) STRUCTURE HAVING A CHIP PACKAGE WITH A PLURALITY OF DIES ATTACHING TO FIRST SIDE OF AN INTERPOSER WITH A DIE FORMED THEREON

(71) Applicant: Taiwan Semiconductor Manufacturing Co., Ltd., Hsin-Chu (TW)

(72) Inventors: Chen-Hua Yu, Hsin-Chu (TW);
Chung-Shi Liu, Hsin-Chu (TW);
Mirng-Ji Lii, Sinpu Township (TW);
Ming-Da Cheng, Jhubei (TW);
Chih-Wei Lin, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/828,244

(22) Filed: Aug. 17, 2015

(65) Prior Publication Data
US 2015/0357320 A1    Dec. 10, 2015

Related U.S. Application Data

(62) Division of application No. 13/271,952, filed on Oct. 12, 2011, now Pat. No. 9,123,763.

(51) Int. Cl.
*H01L 25/10* (2006.01)
*H01L 21/56* (2006.01)
(Continued)

(52) U.S. Cl.
CPC .......... *H01L 25/50* (2013.01); *H01L 21/31051* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 21/76802* (2013.01); *H01L 21/76819* (2013.01); *H01L 21/76877* (2013.01); *H01L 21/76898* (2013.01); *H01L 23/5383* (2013.01); *H01L 24/19* (2013.01); *H01L 24/81* (2013.01); *H01L 25/0657* (2013.01); *H01L 25/105* (2013.01); *H01L 21/4846* (2013.01); *H01L 23/3128* (2013.01);
(Continued)

(58) Field of Classification Search
CPC ............ H01L 21/4853; H01L 21/4857; H01L 21/75819; H01L 21/7684; H01L 21/76885; H01L 24/81; H01L 24/82; H01L 25/117; H01L 25/50
See application file for complete search history.

(56) References Cited

U.S. PATENT DOCUMENTS 5,241,456 A    8/1993   Marcinkiewicz et al.
6,960,827 B2   11/2005  Nishimura et al.
(Continued)

*Primary Examiner* — Anh Mai
(74) *Attorney, Agent, or Firm* — Slater Matsil, LLP

(57) ABSTRACT

A package-on-package (PoP) structure comprises a first package and a second package. The first package comprises a first die, a second die, and a core material. The core material has a first surface and a second surface. A first redistribution layer (RDL) is on the first surface, and a second RDL is on the second surface. The first die is disposed in the core material between the first surface and the second surface. The second die is coupled to one of the first RDL and the second RDL. The second package comprises a third die and an interposer. The interposer has a first side and a second side. The third die is coupled to the second side of the interposer. The first package is coupled to the second package by first electrical connectors coupled to the second side of the interposer and the first RDL.

20 Claims, 32 Drawing Sheets

(51) Int. Cl.

| | | |
|---|---|---|
| *H01L 23/485* | (2006.01) | |
| *H01L 25/00* | (2006.01) | |
| *H01L 23/538* | (2006.01) | |
| *H01L 21/48* | (2006.01) | |
| *H01L 21/768* | (2006.01) | |
| *H01L 25/065* | (2006.01) | |
| *H01L 21/3105* | (2006.01) | |
| *H01L 23/00* | (2006.01) | |
| *H01L 21/683* | (2006.01) | |
| *H01L 23/31* | (2006.01) | |
| *H05K 1/18* | (2006.01) | |
| *H01L 23/498* | (2006.01) | |

(52) U.S. Cl.
CPC .... *H01L 23/49816* (2013.01); *H01L 23/49822* (2013.01); *H01L 23/49827* (2013.01); *H01L 24/16* (2013.01); *H01L 24/32* (2013.01); *H01L 2221/68345* (2013.01); *H01L 2224/131* (2013.01); *H01L 2224/13082* (2013.01); *H01L 2224/16225* (2013.01); *H01L 2224/16237* (2013.01); *H01L 2224/2919* (2013.01); *H01L 2224/32145* (2013.01); *H01L 2224/32225* (2013.01); *H01L 2224/45124* (2013.01); *H01L 2224/45144* (2013.01); *H01L 2224/73204* (2013.01); *H01L 2224/73253* (2013.01); *H01L 2224/81005* (2013.01); *H01L 2224/81191* (2013.01); *H01L 2224/81815* (2013.01); *H01L 2224/83104* (2013.01); *H01L 2225/06513* (2013.01); *H01L 2225/06548* (2013.01); *H01L 2225/06555* (2013.01); *H01L 2225/06572* (2013.01); *H01L 2225/06589* (2013.01); *H01L 2225/1023* (2013.01); *H01L 2225/1058* (2013.01); *H01L 2924/00014* (2013.01); *H01L 2924/12042* (2013.01); *H01L 2924/15311* (2013.01); *H01L 2924/15331* (2013.01); *H01L 2924/181* (2013.01); *H05K 1/185* (2013.01)

(56) References Cited

U.S. PATENT DOCUMENTS

| | | |
|---|---|---|
| 7,226,808 B2 | 6/2007 | Aoyagi |
| 7,230,329 B2 | 6/2007 | Sawamoto et al. |
| 7,321,164 B2 | 1/2008 | Hsu |
| 7,498,666 B2 | 3/2009 | Hussa |
| 7,573,136 B2 | 8/2009 | Jiang et al. |
| 7,781,877 B2 | 8/2010 | Jiang et al. |
| 8,174,109 B2 | 5/2012 | Uchiyama |
| 8,519,544 B2 | 8/2013 | Kim et al. |
| 8,975,741 B2 | 3/2015 | Lin et al. |
| 9,117,816 B2 | 8/2015 | Lin et al. |
| 2006/0170098 A1 | 8/2006 | Hsu |
| 2008/0136004 A1 | 6/2008 | Yang et al. |
| 2009/0039491 A1 | 2/2009 | Kim et al. |
| 2009/0261466 A1 | 10/2009 | Pagaila et al. |
| 2010/0252937 A1 | 10/2010 | Uchiyama |
| 2010/0314738 A1 | 12/2010 | Chi et al. |
| 2011/0068464 A1 | 3/2011 | Chi et al. |
| 2012/0199972 A1 | 8/2012 | Pagaila et al. |
| 2012/0223426 A9 | 9/2012 | Shim et al. |
| 2012/0286404 A1 | 11/2012 | Pagaila |
| 2013/0049208 A1 | 2/2013 | Cho et al. |
| 2013/0093097 A1 | 4/2013 | Yu et al. |
| 2014/0264905 A1 | 9/2014 | Lee et al. |

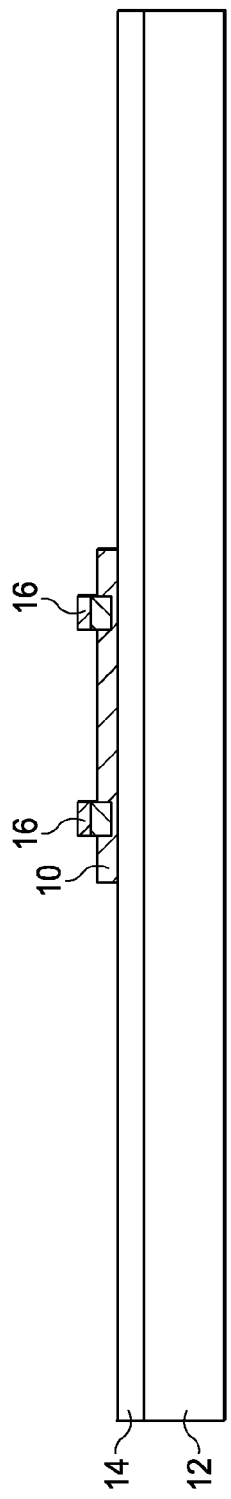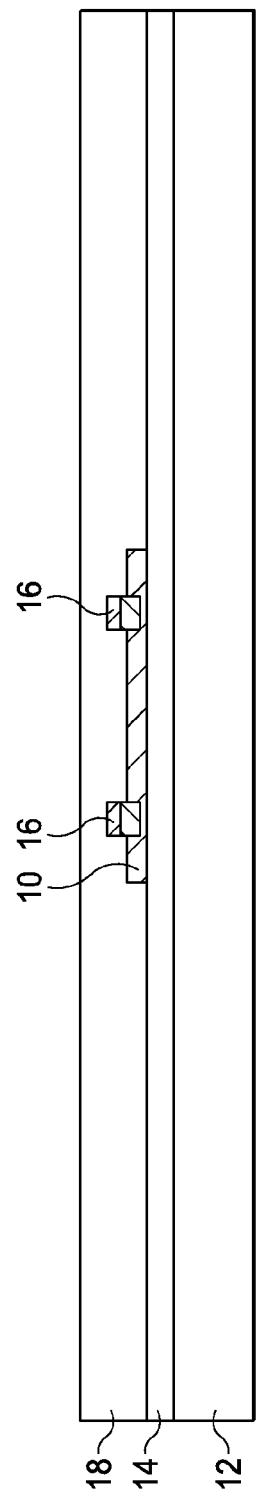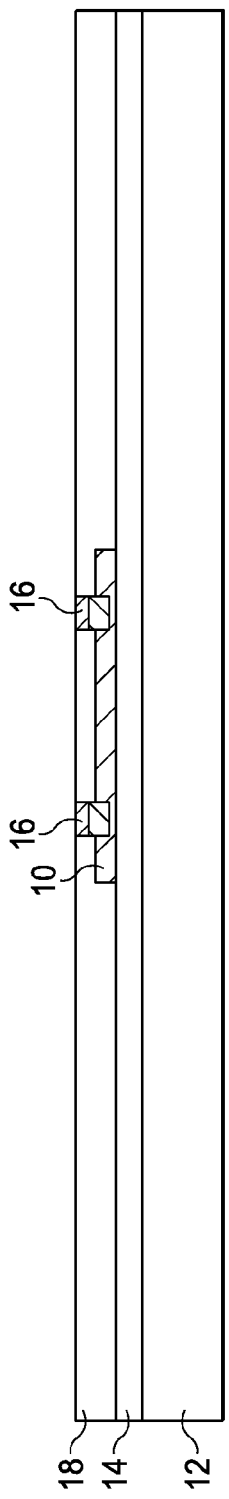

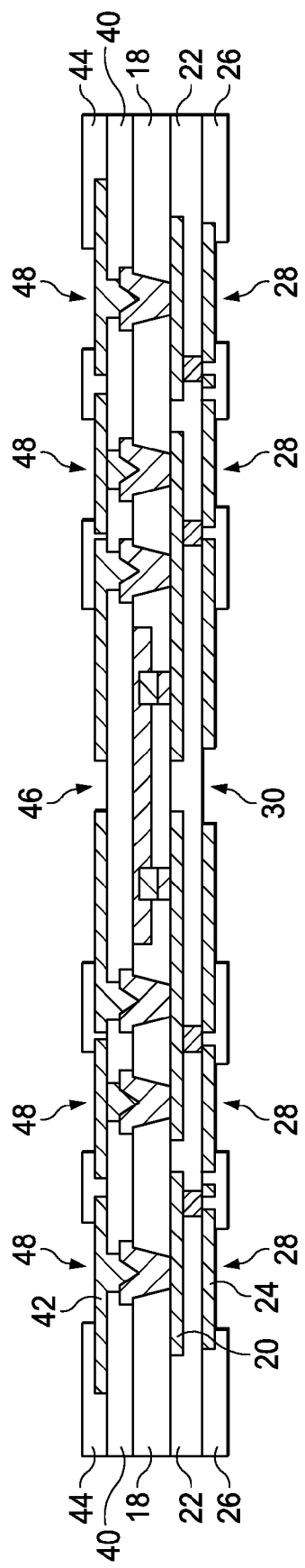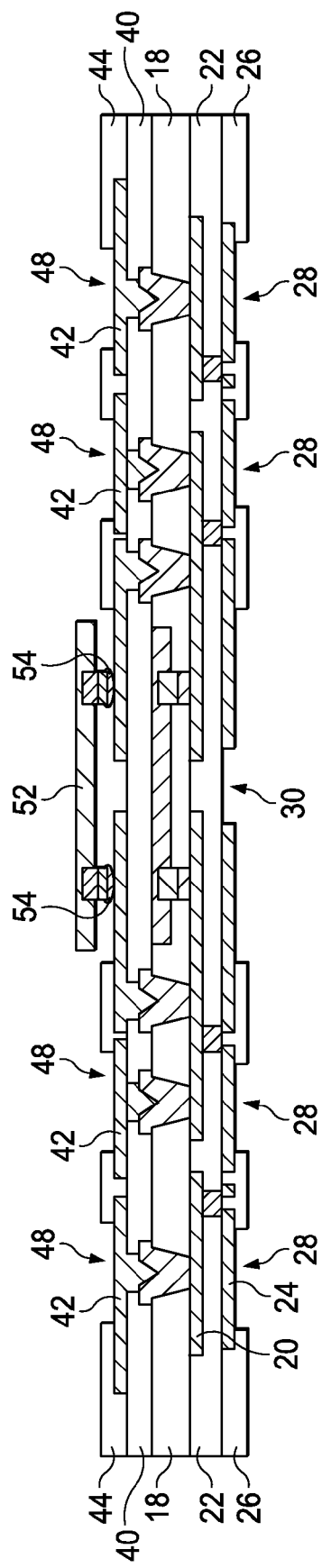

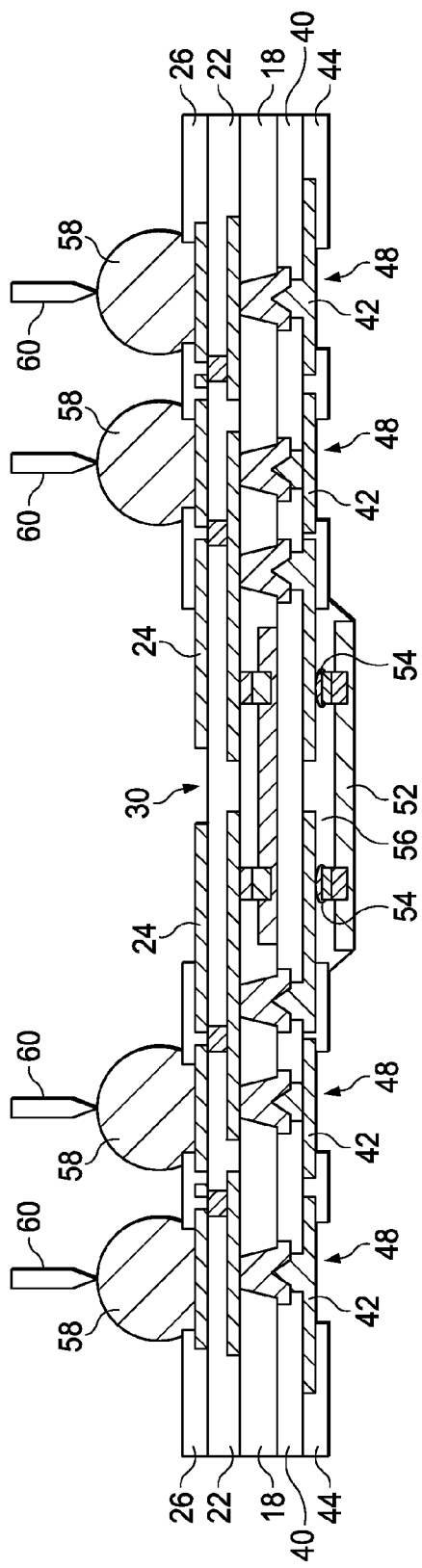
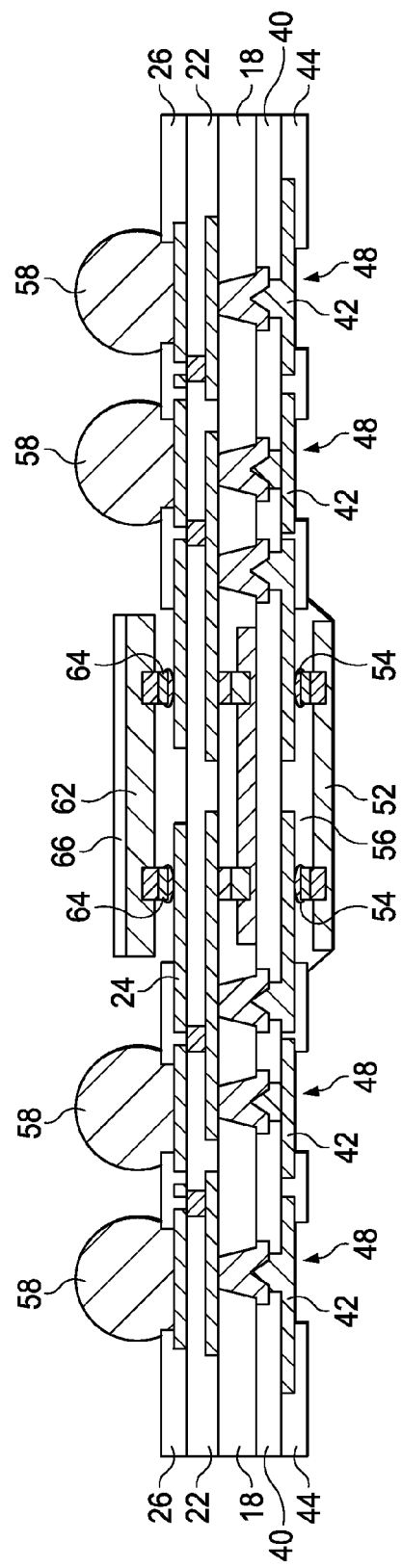
FIG. 14
FIG. 15

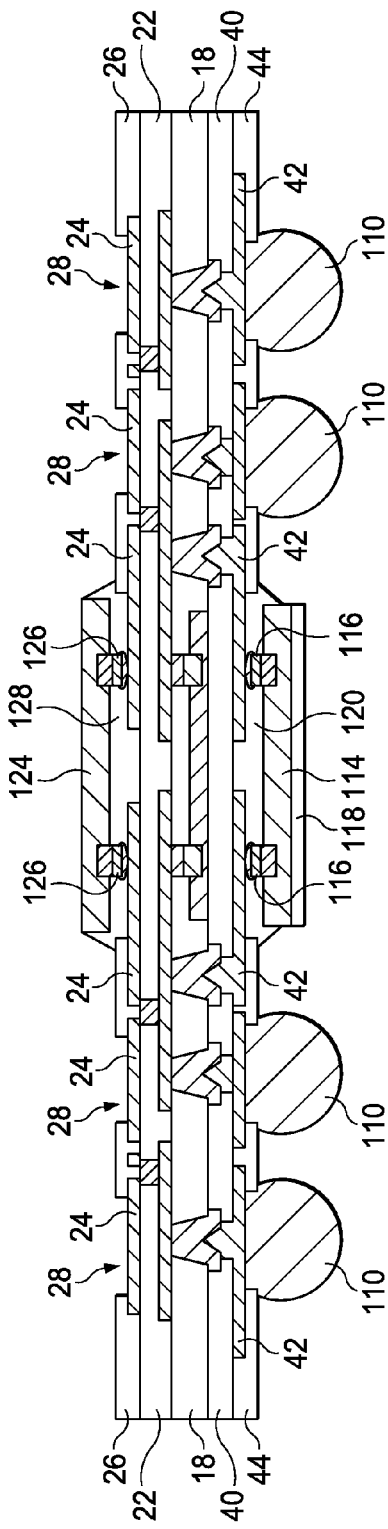
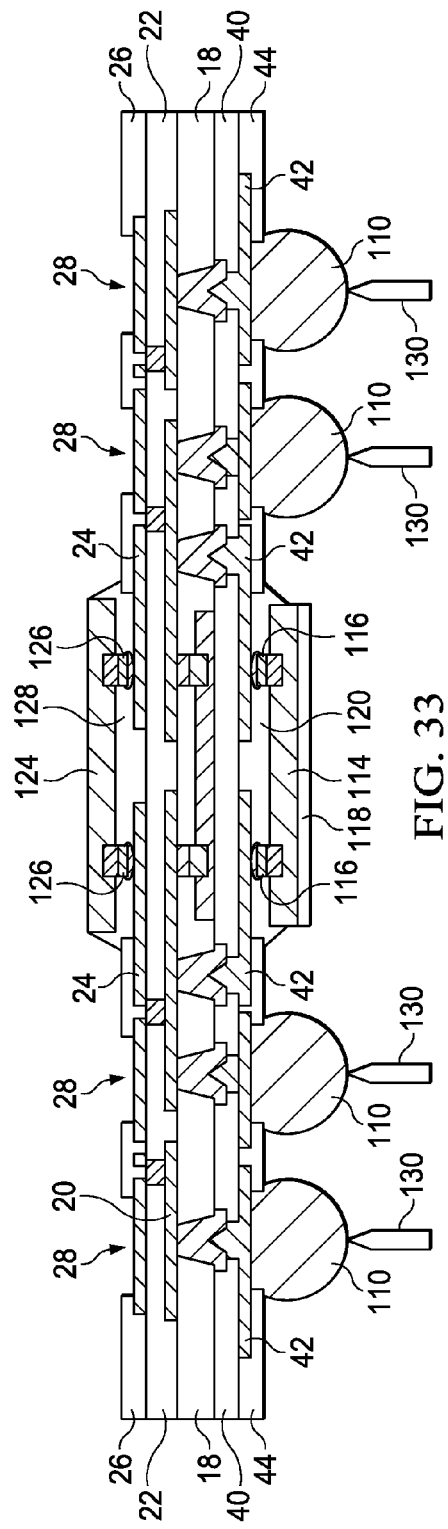
FIG. 32
FIG. 33

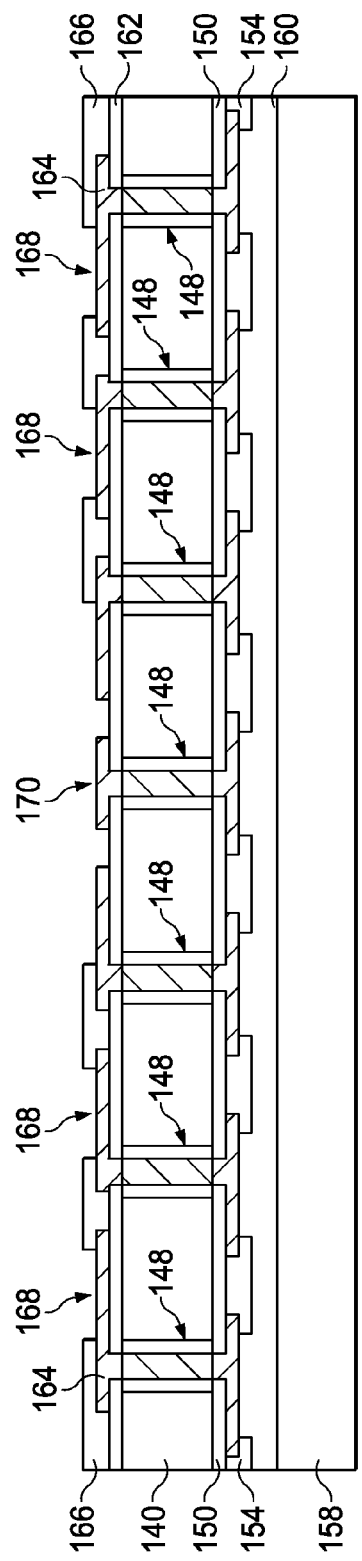
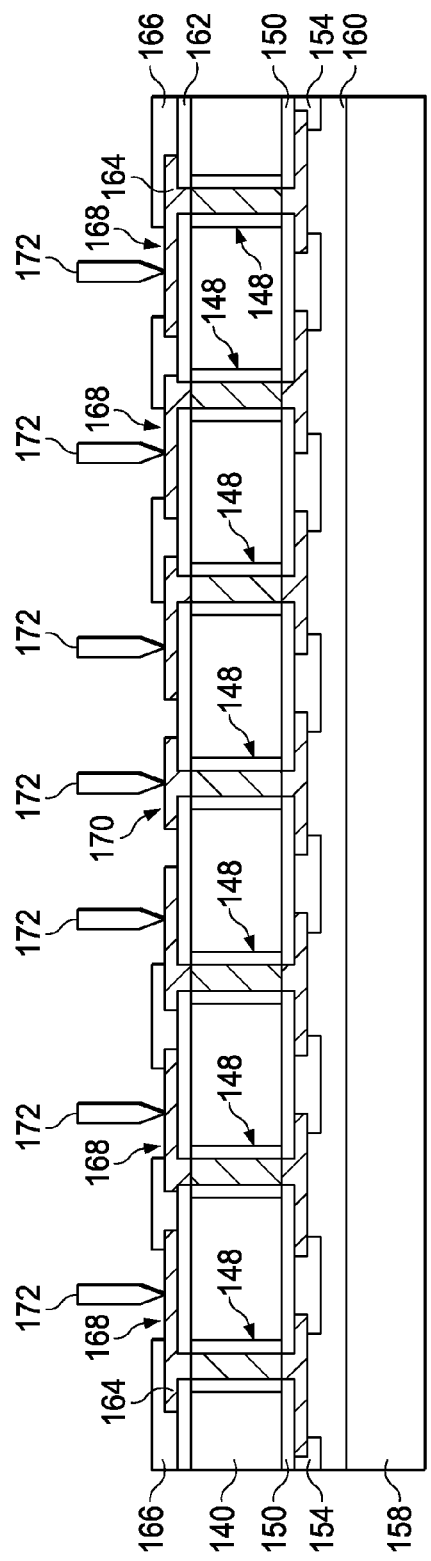
FIG. 41
FIG. 42

METHOD OF FORMING PACKAGE-ON-PACKAGE (POP) STRUCTURE HAVING A CHIP PACKAGE WITH A PLURALITY OF DIES ATTACHING TO FIRST SIDE OF AN INTERPOSER WITH A DIE FORMED THEREON

This application is a divisional of U.S. patent application Ser. No. 13/271,952, filed on Oct. 12, 2011, entitled "Package-On-Package (PoP) Structure Comprising at Least One Package Comprising a Die Disposed in a Core Material," which application is hereby incorporated herein by reference in its entirety.

BACKGROUND

Electronics can be divided into a simple hierarchy consisting of devices such as integrated circuit (IC) chips, packages, printed circuit boards (PCB) and a system. The package is the interface between an electronic device, such as a computer chip, and a PCB. Devices are made from semiconductor materials such as silicon. Integrated circuits are assembled into a package such as a quad flat pack (QFP), pin grid array (PGA), or ball grid array (BGA), using wire bonding (WB), tape automated bonding (TAB), or flip chip (FC) bumping assembly techniques. The packaged device is then attached either directly to a printed wiring board or to another type of substrate, which is defined as the second level of packaging.

Ball grid array (BGA) packaging technology generally is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. The BGA package may be employed in a memory such as Dynamic Random Access Memory and others.

A basic flip-chip (FC) packaging technology comprises an IC, an interconnect system, and a substrate. A function chip is connected to the substrate with a plurality of solder bumps, wherein the solder bumps forming a metallurgical interconnection between the chip and the substrate. The function chip, the solder bump, and the substrate form a flip-chip package. Further, a plurality of balls form a ball grid array (BGA).

Wire bonding can be used to make the electrical connections from chip components such as chip resistors or chip capacitors to substrate. Two function chips and are stacked on top of a plurality of substrate layers. The chips are connected to the substrate by a plurality of bonding gold wires. Other form of wires such as aluminum wire can be used, too. The function chips, the gold wire, and the substrate form a wire bonding (WB) package.

Package-on-Package (PoP) is an integrated circuit packaging technique to allow vertically combining discrete logic and memory ball grid array (BGA) packages. Two or more packages are installed on top of one another, i.e. stacked, with a standard interface to route signals between them. This allows higher density, for example in the mobile telephone/PDA market.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 8 are a first portion of a process for forming a package according to an embodiment;

FIGS. 9 through 17 are a first example of a second portion of a process for forming a package according to an embodiment;

FIGS. 25 through 33 are another example of another portion of a process for forming a package according to an embodiment;

FIGS. 34 through 48 are a process for forming a package with an interposer according to an embodiment;

DETAILED DESCRIPTION OF ILLUSTRATIVE EMBODIMENTS

Figure 4:
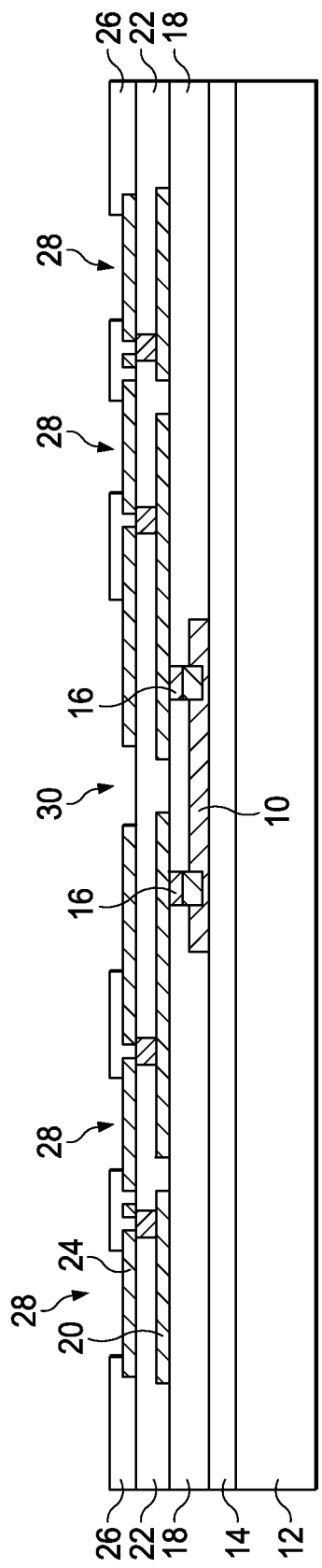

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a package-on-package (PoP) structure and methods for forming a PoP structure. Although the example methods are discussed in a particular order, embodiments contemplate that a method may be performed in any logical order.

FIG. 1 shows a first die 10 on a first carrier substrate 12. A back side of the first die 10 is attached to the first carrier substrate 12 by an adhesive 14. A front side, or active side, of the first die 10 has conductive features 16 which are electrically coupled to active devices in the first die 10. In this embodiment, the conductive features 16 are conductive pillars, such as copper, the like, or a combination thereof. In other embodiments, the conductive features 16 may be any structure upon which a metallization layer may be electrically coupled, as discussed later in more detail. The first die 10 can be a logic circuitry die, a memory die, or any other die.

Generally, the first carrier substrate 12 provides temporary mechanical and structural support during subsequent processing steps. The first carrier substrate 12 may comprise, for example, glass, silicon oxide, aluminum oxide, a combination thereof, and/or the like and may be a wafer. The adhesive 14 may be any suitable adhesive, such as ultraviolet (UV) glue, which loses its adhesive property when exposed to UV lights. It should be noted that multiple dies can be attached to the first carrier substrate 12.

FIG. 2 shows a core material, such as molding compound 18, applied and cured over the first die 10 and the first carrier substrate 12. The molding compound 18 can be an epoxy, polyimide, silicone rubber, the like, or a combination thereof. The molding compound 18 can be applied using acceptable techniques, such as compression molding. In FIG. 3, the molding compound 18 is ground and/or polished to expose the conductive features 16 on the first die 10. The grinding and/or polishing may be performed using a chemical mechanical polishing (CMP) process.

FIG. 4 illustrates a front side interlayer dielectric (ILD) and redistribution layer (RDL) structure. A seed layer, such as a copper, titanium, or the like, is deposited on the molding compound 18, such as by sputtering or another physical vapor deposition (PVD) process. A photo resist is deposited on the seed layer and patterned to expose portions of the seed layer by photolithography. The pattern is for a first metallization layer on the front side. Conductive material of the first metallization layer, such as copper, aluminum, the like, or a combination thereof, is deposited on the exposed seed layer, such as by electroless plating, electroplating, or the like. The photoresist is removed by an ash and/or flush process. The exposed seed layer removed, such as by a wet or dry etch. The remaining conductive material forms the first front side metallization layer 20, portions of which are electrically coupled to the conductive features 16.

A first ILD layer 22 is deposited on the front side and over the first metallization layer 20. The first ILD layer 22 may be a polyimide, polybenzoxazole (PBO), benzocyclobutene (BCB), the like, or a combination thereof. The first ILD layer 22 can be deposited by a coating process, a lamination process, the like, or a combination thereof. Openings may be formed through the first ILD layer 22 to the first metallization layer 20 using acceptable photolithography techniques.

Subsequent metallization layers and ILD layers, such as a second metallization layer 24 and a second ILD layer 26, may be formed using the same or similar processes as discussed with regard to the first metallization layer 20 and the first ILD layer 22. Conductive material deposited during the formation of a subsequent metallization layer may be deposited in openings of the previously formed ILD layer to electrically couple respective metallization layers. After forming the topmost ILD layer, the second ILD layer 26 in this embodiment, openings 28 and 30 are formed through the topmost front side ILD layer for connectors coupled between the topmost front side metallization layer, such as the second metallization layer 24, and another package, another die, and/or another substrate. It should be noted that any number of metallization layers and ILD layers may be formed, and the use of two in this embodiment is used as an example.

Figure 5:
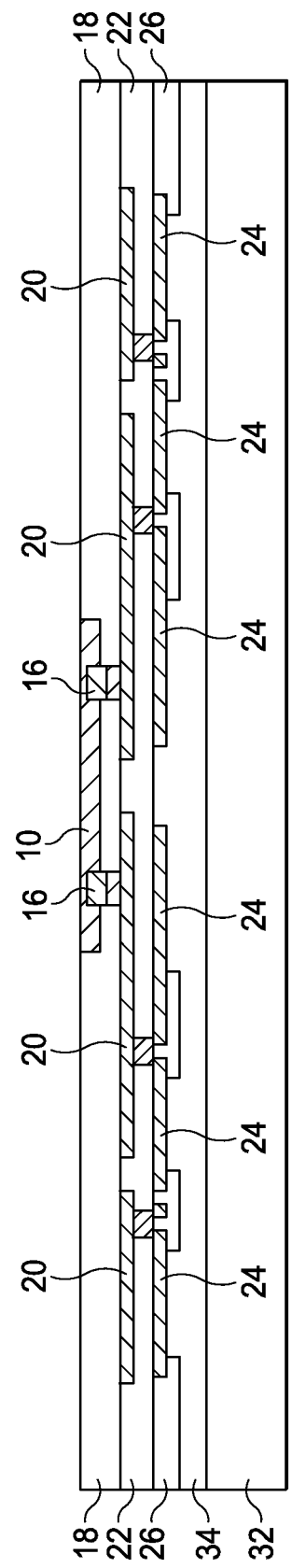

FIG. 5 shows the de-bonding of the backside of the intermediate structure from the first carrier substrate 12 and bonding the front side of the intermediate structure to a second carrier substrate 32. The de-bonding from the first carrier substrate 12 may comprise exposing the adhesive 14 to UV lights, such as a laser, or by exposing the adhesive 14 to a solvent. The front side is bonded by an adhesive 34. The second carrier substrate 32 may comprise, for example, glass, silicon oxide, aluminum oxide, a combination thereof, and/or the like and may be a wafer. The adhesive 34 may be any suitable adhesive, such as UV glue, which loses its adhesive property when exposed to UV lights.

Figure 6:
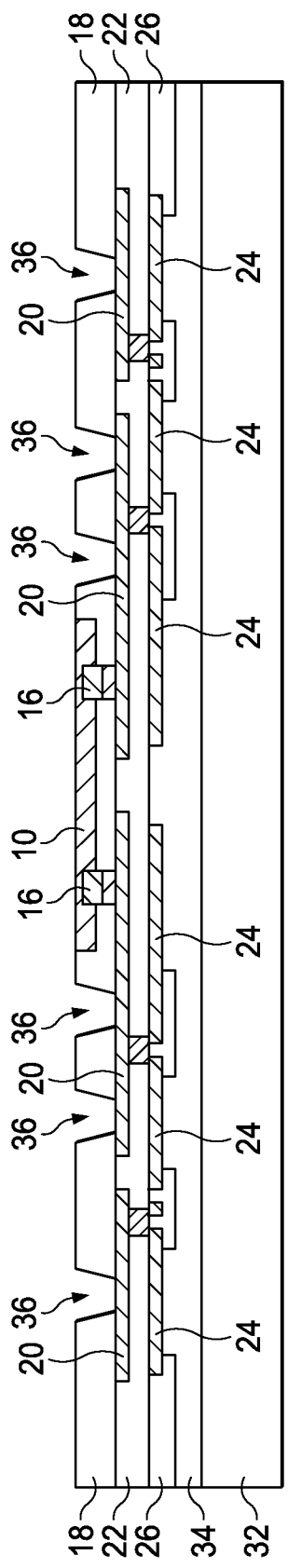
Figure 7:
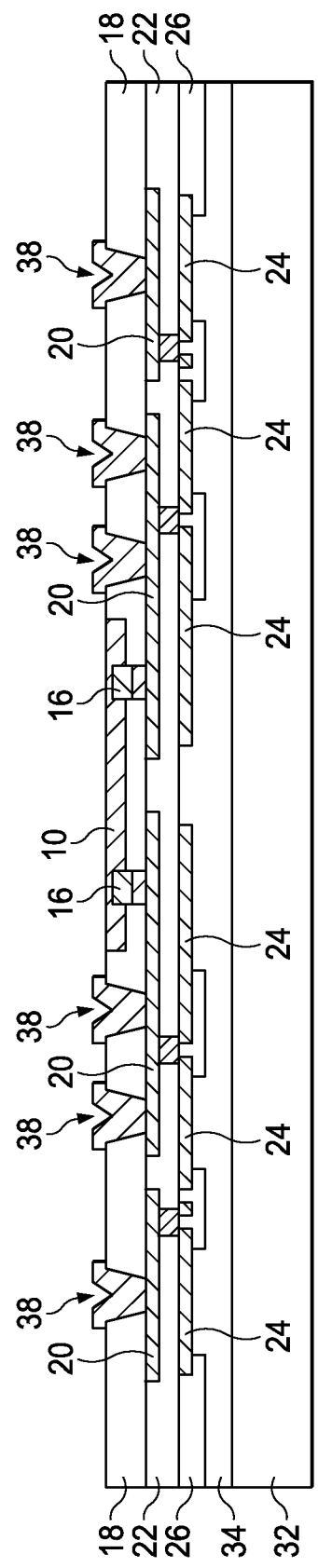

FIG. 6 illustrates a through molding via (TMV) opening formation. TMV openings 36 are formed through the molding compound 18 to the first front side metallization layer 20 by, for example, a laser technique or a mechanical process like drilling. FIG. 7 shows the TMVs 38 being formed. A seed layer is deposited over the back side of the structure and into the TMV openings 36. The seed layer can be copper, titanium, the like, or a combination thereof deposited by sputtering, another PVD process, or the like. A photoresist is deposited and patterned exposing the TMV openings 36 and any other pattern for a metallization layer that is desired, such as by acceptable photolithography techniques. A conductive material, such as copper, aluminum, the like, or a combination thereof, is deposited on the back side by electroless plating, electroplating, or the like. The photoresist is removed, such as by an ash and/or flush process. Remaining exposed seed layer portions are removed, such as by a wet or dry etch. TMVs 38 remain along with any further metallization pattern.

Figure 8:
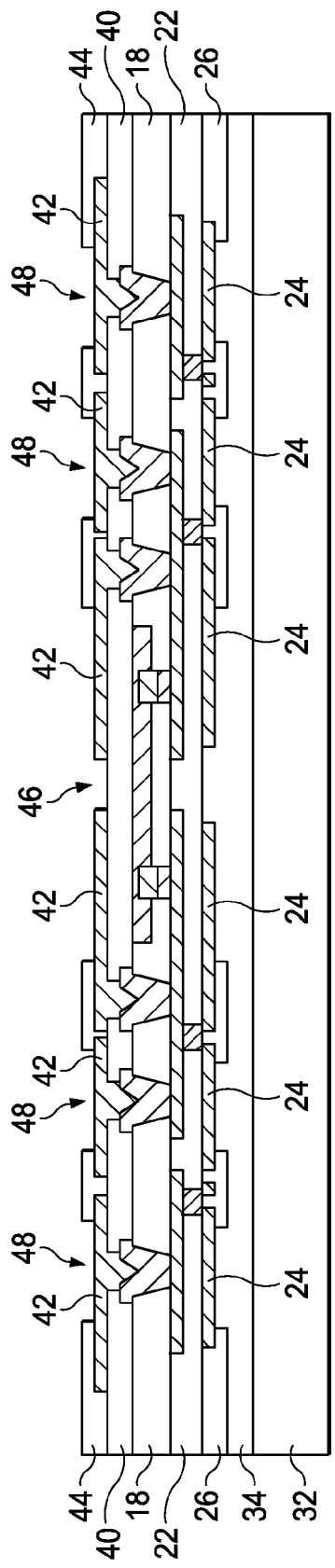

FIG. 8 illustrates a back side ILD and RDL structure. FIG. 8 shows first back side ILD layer 40, a second back side metallization layer 42, a second ILD layer 44, and openings 46 and 48 through the second ILD layer 44 to the second back side metallization layer 42. These may be formed the similar to or in the same manner as the ILD layers and metallization layers on the front side, and therefore, explicit description of the formation of these features is omitted for brevity. Any number of metallization and ILD layers may be formed on the back side.

Figure 9:
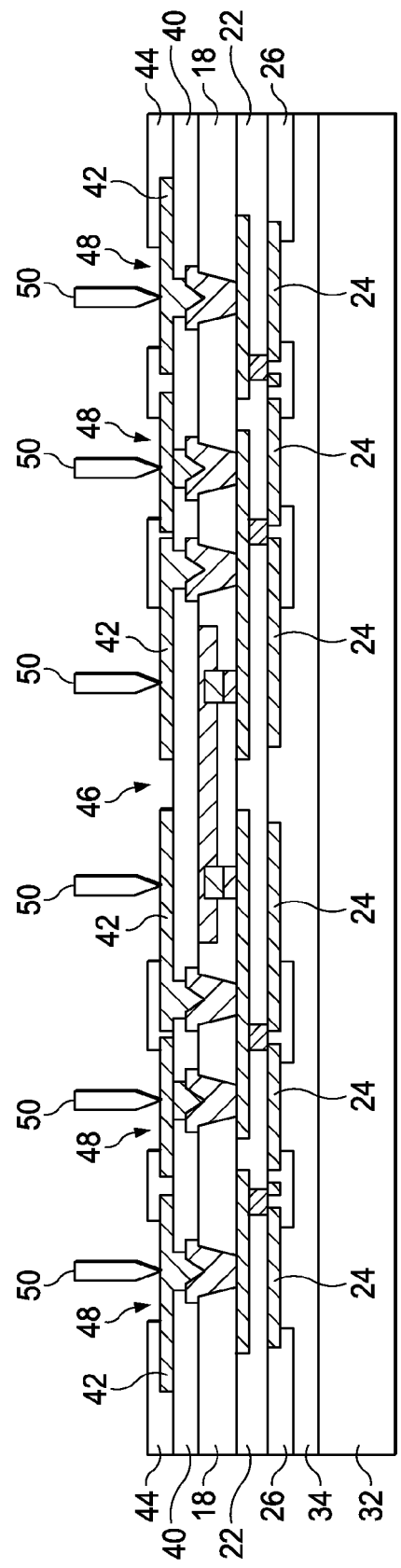

FIGS. 9 through 17 illustrate a first example method for processing at a package level. FIG. 9 illustrates a probing step to test the first die 10 and the interconnects formed by the metallization layers and ILD layers on the front side and the back side. The second back side metallization layer 42 is probed by pins 50 of a probe card through the openings 46 and 48. In FIG. 10, the structure is de-bonded from the second carrier substrate 32, such as by exposing the adhesive 34 to UV lights, such as a laser, or by exposing the adhesive 34 to a solvent. Further, individual packages are singulated, such as by sawing. Known good packages, such as determined by the probing in FIG. 9, may subsequently be used during processing.

Figure 12:
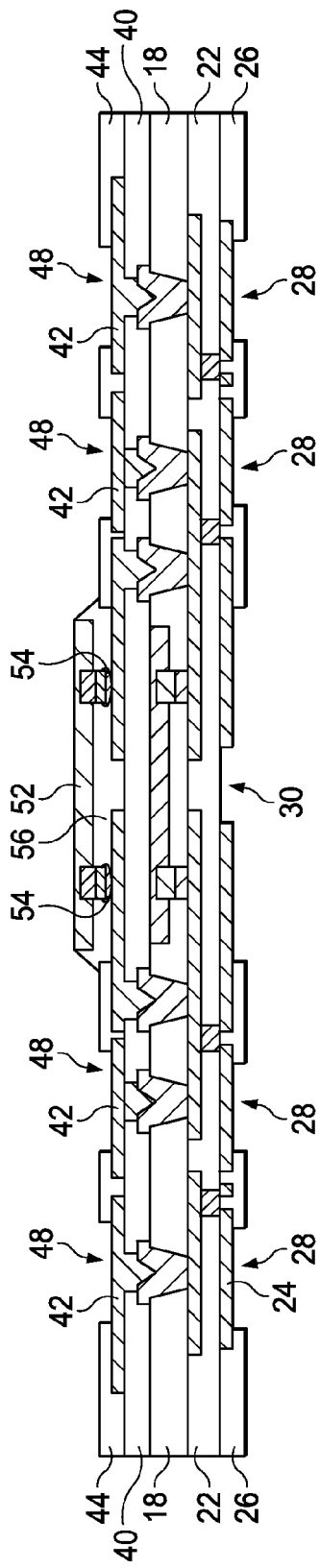

In FIG. 11, a second die 52, such as a memory die having a thickness of less than or equal to 3 mils, is attached through the opening 46 to conductive features in the second back side metallization layer 42, such as by conductive connectors 54, like controlled collapse chip connection (C4) bumps. The second die 52 may be attached using an acceptable pick-and-place tool and reflowing connectors 54 between the second die 52 and the conductive features in the second back side metallization layer 42. Accordingly, the connectors 54 may be a bump on trace (BOT). In FIG. 12, an underfill material 56, such as liquid epoxy, deformable gel, silicon rubber, the like, or a combination thereof, is dispensed and cured between the second die 52 and the back side of the package, such as between the second die 52 and the second metallization layer 42.

Figure 13:
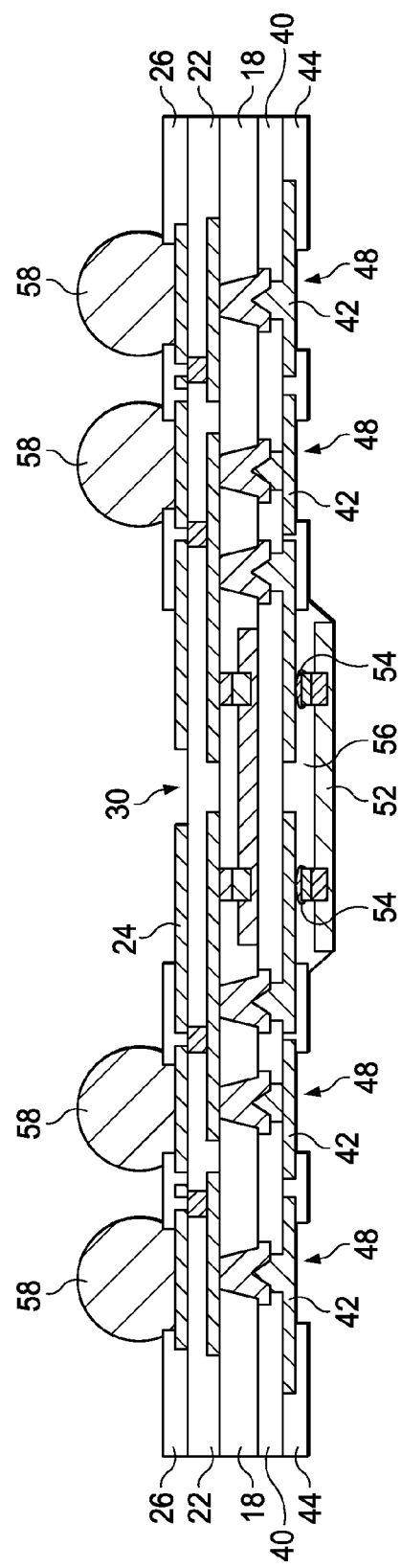

FIG. 13 shows the formation of conductive connectors 58, such as ball grid array (BGA) balls, on the front side of the package in the openings 28. Bond pads may be formed in the openings 28 on the front side of the package, and connectors 58 may be formed on the bond pads. The connectors 58 may be a lead-free solder. In FIG. 14, the connectors 58 are probed by pins 60 of a probe card to test the structure. Known good packages can be used in further processing.

Figure 16:
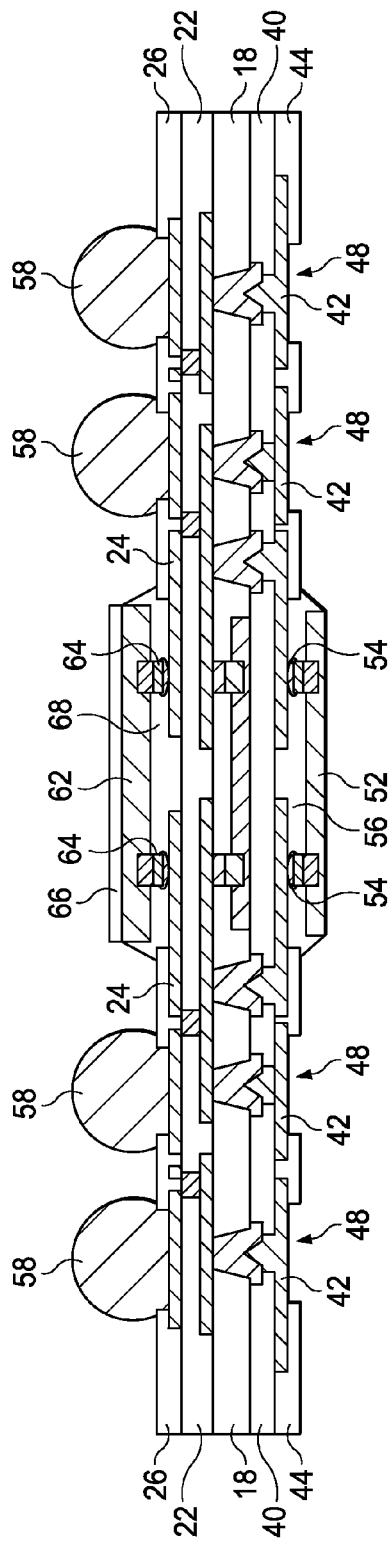
Figure 17:
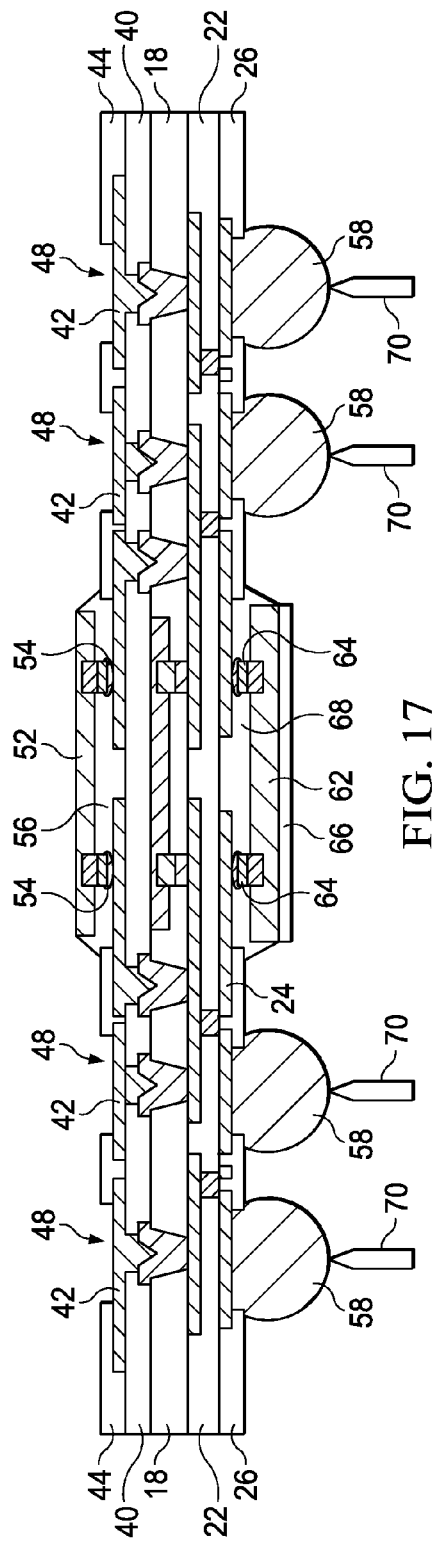

FIG. 15 shows a third die 62, such as a memory die having a thickness of less than or equal to 3 mils, attached through the opening 30 to conductive features in the second front side metallization layer 24. The third die 62 may be attached using an acceptable pick-and-place tool and reflowing connectors 64, such as C4 bumps, between the third die 62 and the conductive features in the second front side metallization layer 24. Accordingly, the connectors 64 may be a BOT. The third die 62 also has a thermal interface material 66 on a back side of the third die 62. The thermal interface material 66 may be coated on the back side of the third die 62 before the third die 62 was singulated from the wafer in which it was processed. The thermal interface material 66 may be an epoxy, rubber, metal (such as silver or gold), the like, or a combination thereof. In FIG. 16, an underfill material 68, such as liquid epoxy, deformable gel, silicon rubber, the like, or a combination thereof, is dispensed and cured between the third die 62 and the front side of the package, such as between the third die 62 and the second metallization layer 24. In FIG. 17, the connectors 58 are probed using pins 70 of a probe card to test the structure. Known good packages can be used in further processing.

FIGS. 18 through 24 illustrate a second example method for processing at a package level. Many of the components in FIGS. 18 through 24 are the same as or similar to components discussed with respect to FIGS. 11 through 17. A person having ordinary skill in the art will readily understand these similarities, and therefore, some explicit discussion of these components is omitted for brevity.

Figure 18:
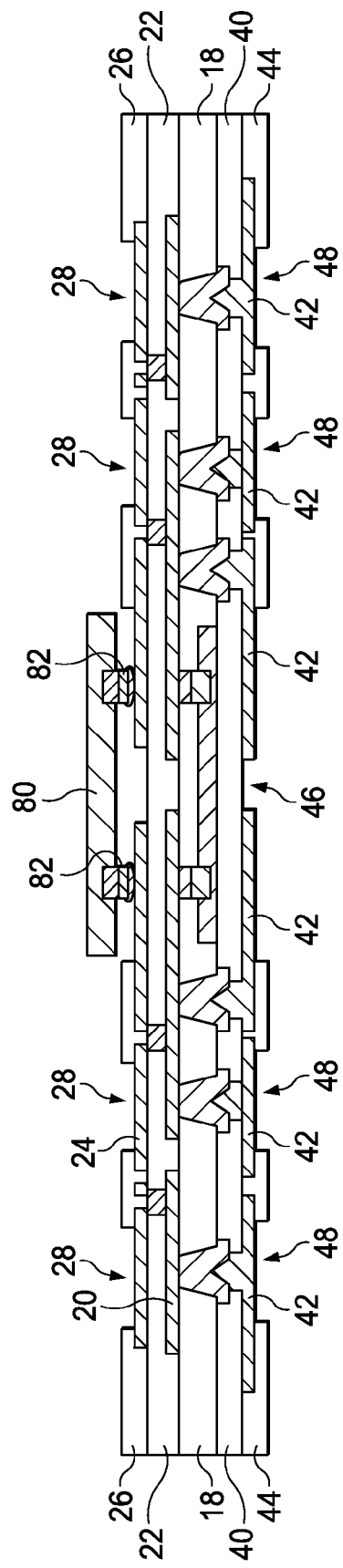
FIGS. 18 through 24 are a second example of a second portion of a process for forming a package according to an embodiment.
Figure 19:
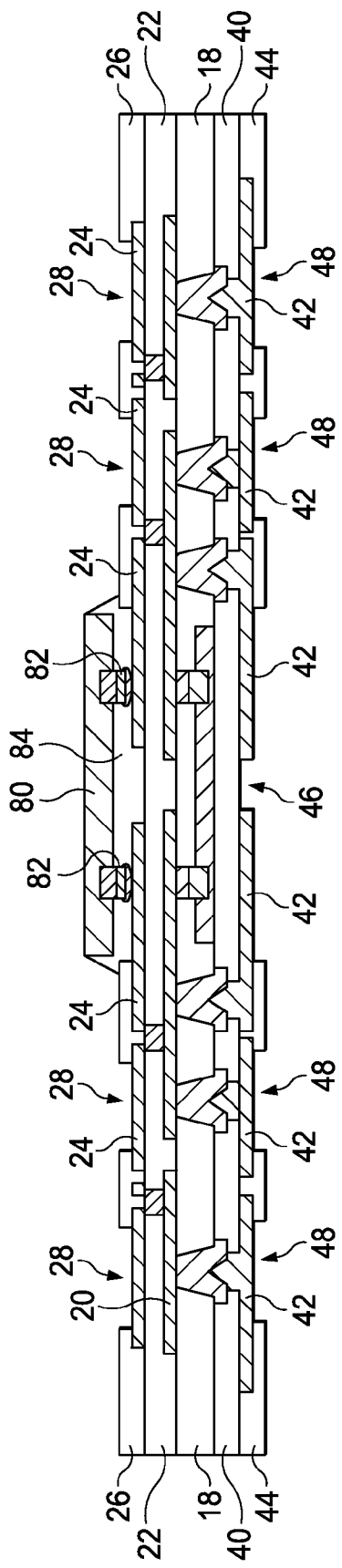

After processing through FIG. 10, FIG. 18 shows a second die 80, such as a memory die having a thickness of less than or equal to 3 mils, attached through the opening 30 to conductive features in the second front side metallization layer 24 by conductive connectors 82, such as C4 bumps. In FIG. 19, an underfill material 84 is dispensed and cured between the second die 80 and the front side of the package, such as between the second die 80 and the second metallization layer 24.

Figure 20:
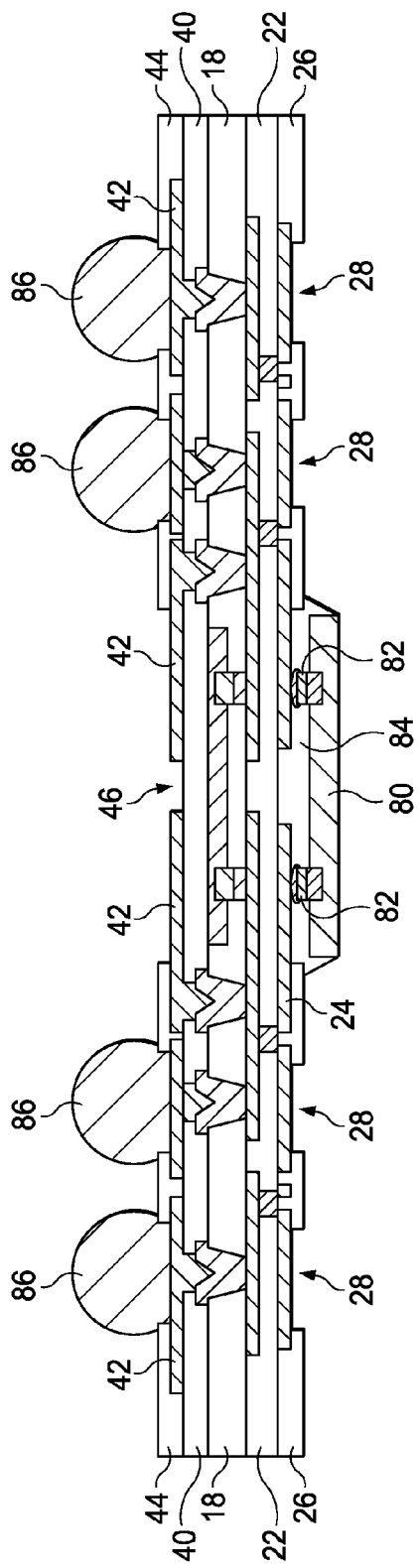
Figure 21:
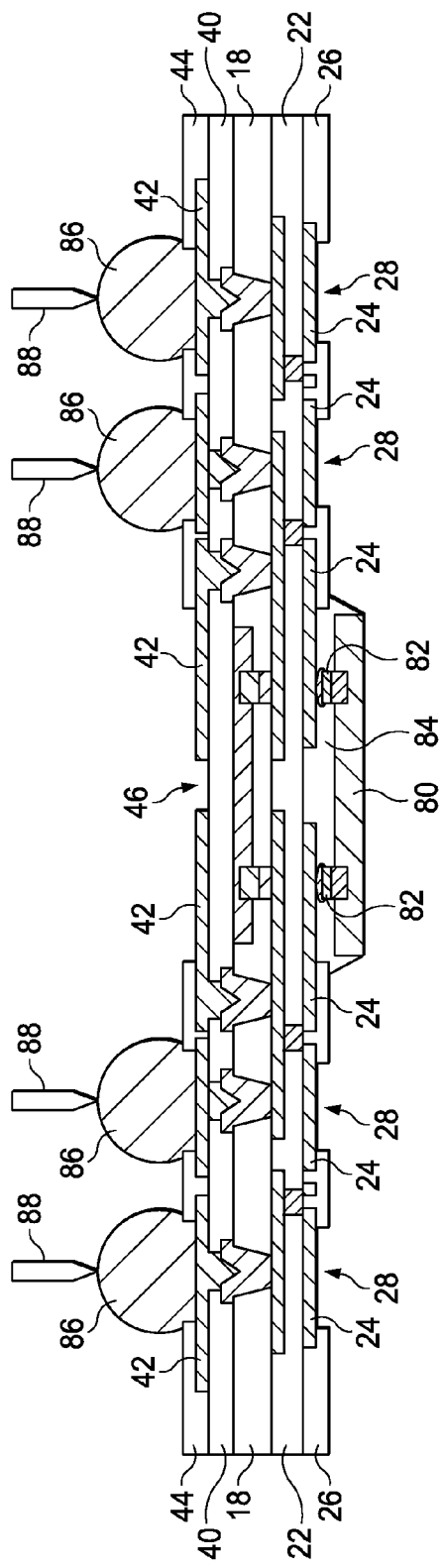

FIG. 20 shows the formation of conductive connectors 86, such as BGA balls, on the back side of the package. Bond pads may be formed in the openings 48 on the back side of the package, and connectors 86 may be formed on the bond pads. In FIG. 21, the connectors 86 are probed by pins 88 of a probe card to test the structure. Known good packages can be used in further processing.

Figure 22:
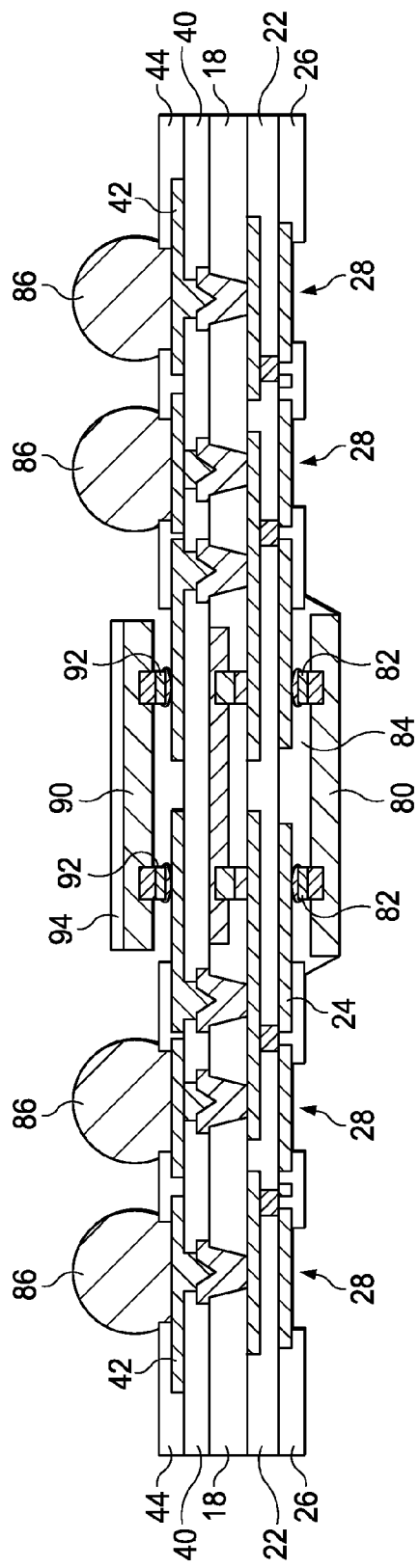
Figure 23:
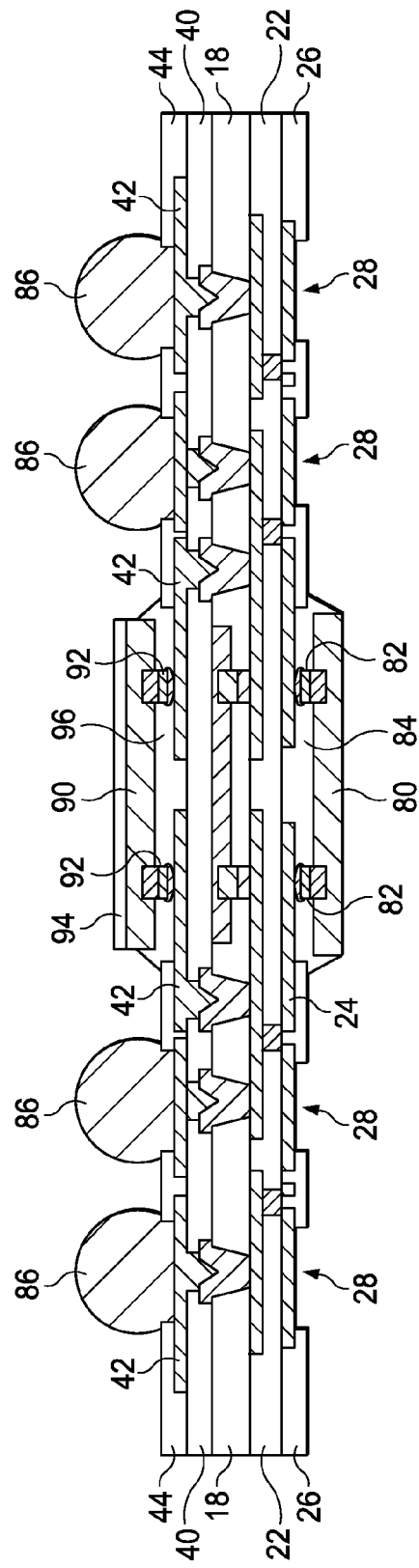
Figure 24:
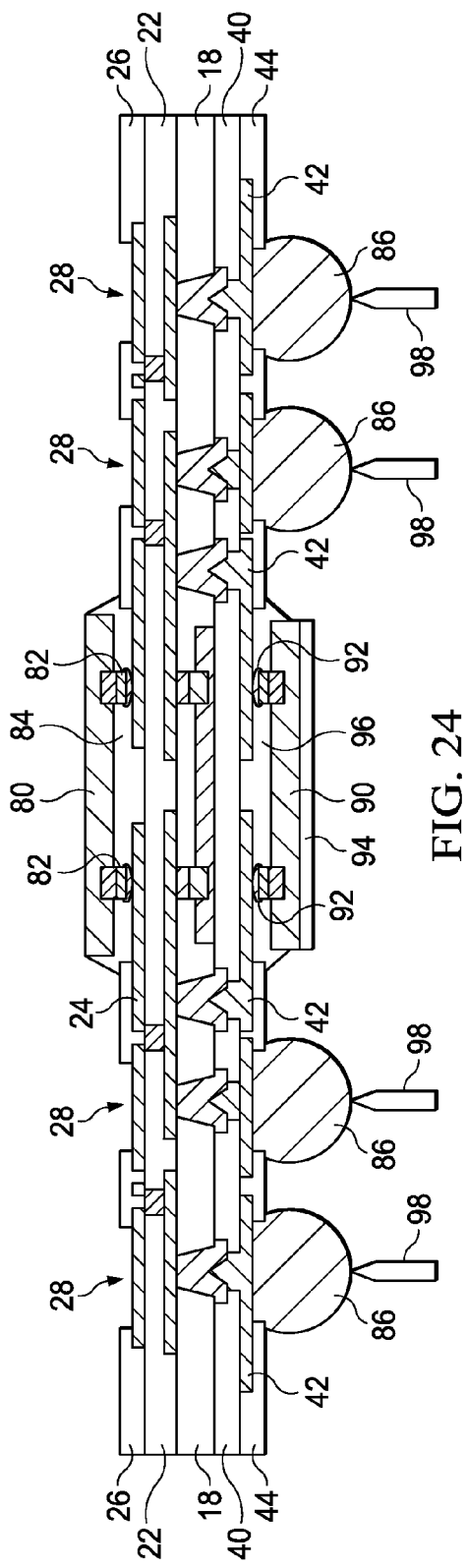

FIG. 22 shows a third die 90, such as a memory die having a thickness of less than or equal to 3 mils, with a thermal interface material 94 on a back side, and the third die 90 is attached through the opening 46 to conductive features in the second back side metallization layer 42 by conductive connectors 92, such as C4 bumps. In FIG. 23, an underfill material 96 is dispensed and cured between the third die 90 and the back side of the package, such as between the third die 90 and the second metallization layer 42. In FIG. 24, the connectors 86 are probed by pins 98 of a probe card to test the structure. Known good packages can be used in further processing.

FIGS. 25 through 33 illustrate an example method for processing at a wafer level. As with the previous examples, many of the components in FIGS. 25 through 33 are the same as or similar to components discussed with respect to previous figures. A person having ordinary skill in the art will readily understand these similarities, and therefore, some explicit discussion of these components is omitted for brevity.

Figure 25:
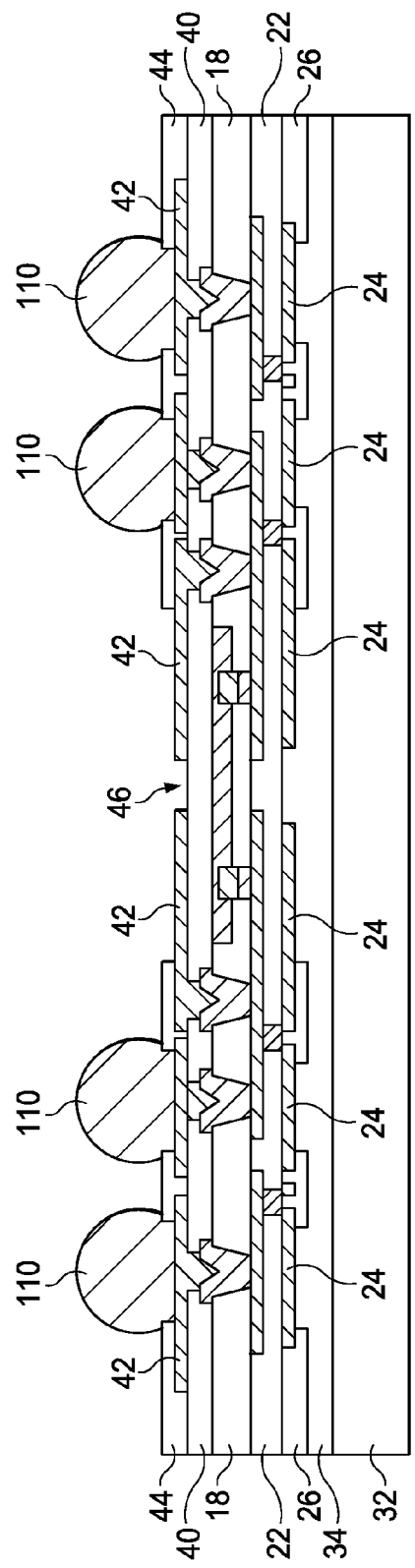
Figure 26:
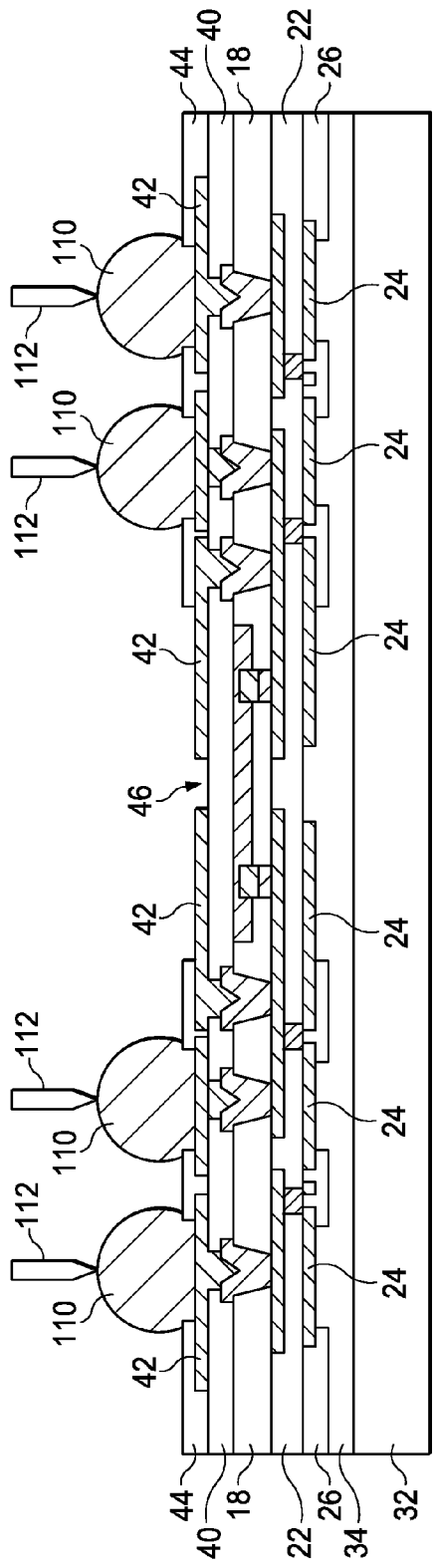

After processing through FIG. 8, the conductive connectors 110, such as BGA balls, are formed in openings 48 on the back side of the package, as shown in FIG. 25. Bond pads may be formed in the openings 48 on the back side of the package, and connectors 110 may be formed on the bond pads. The connectors may be a lead-free solder. In FIG. 26, the connectors 110 are probed by pins 112 of a probe card to test the structure. Known good packages can be used in further processing.

Figure 27:
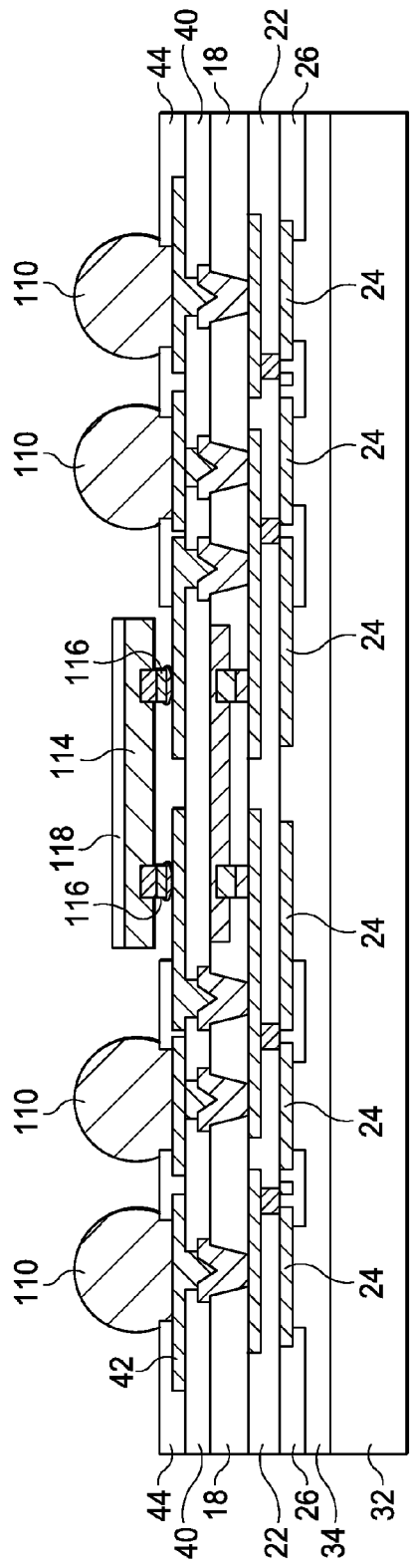
Figure 28:
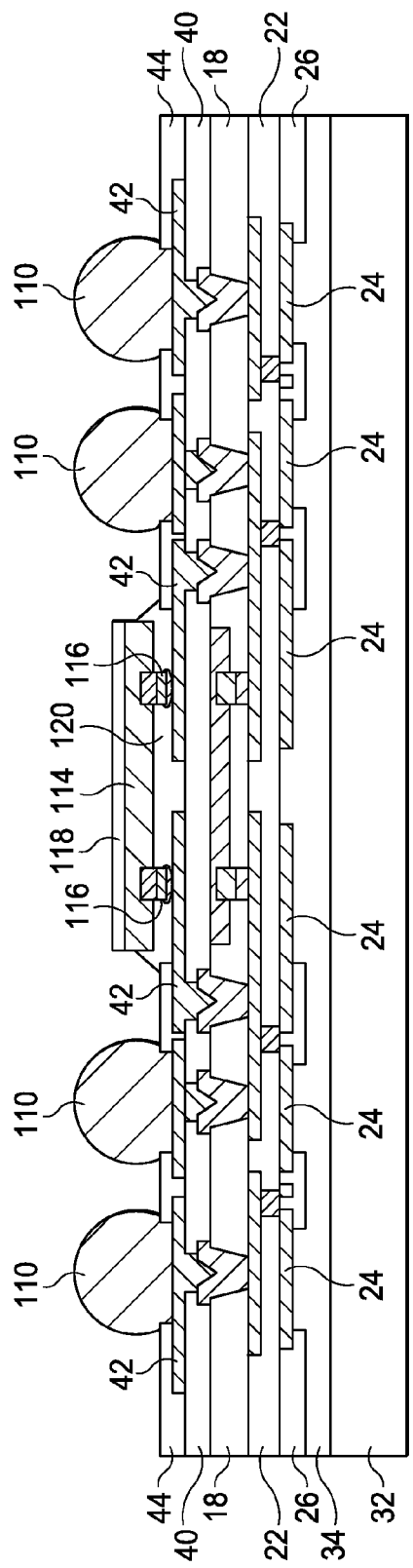
Figure 29:
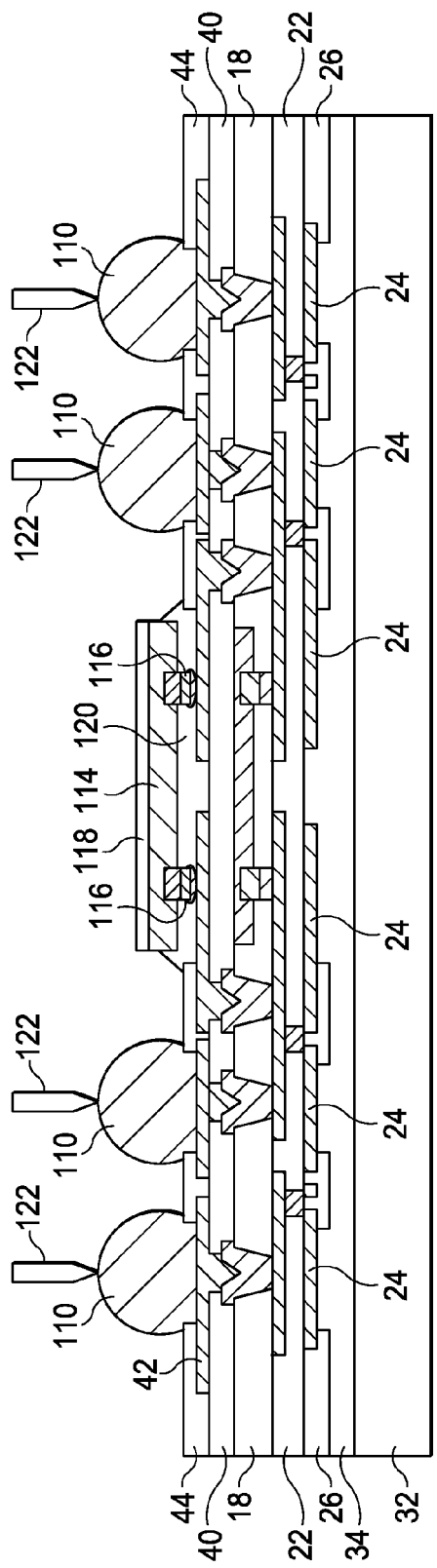
Figure 30:
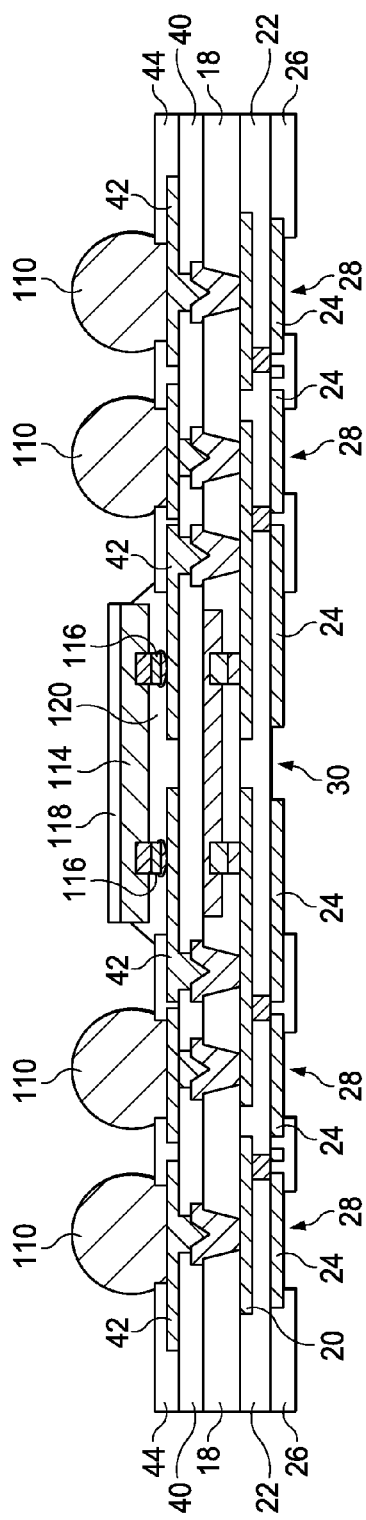

In FIG. 27, a second die 114, such as a memory die having a thickness of less than or equal to 3 mils, with a thermal interface material 118 on a back side is attached through the opening 46 to conductive features in the second back side metallization layer 42 by conductive connectors 116, such as C4 bumps. In FIG. 28, an underfill material 120 is dispensed and cured between the second die 114 and the back side of the package, such as between the second die 114 and the second metallization layer 42. In FIG. 29, the connectors 110 are probed by pins 122 of a probe card to test the structure. Known good packages can be used in further processing. In FIG. 30, the structure is de-bonded from the second carrier substrate 32, and individual packages are singulated.

Figure 31:
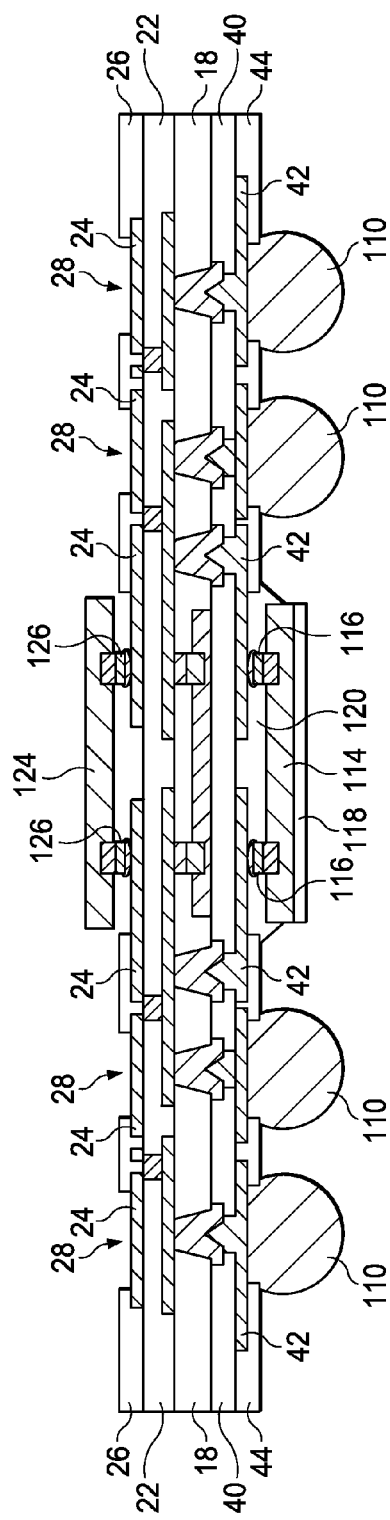

FIG. 31 shows a third die 124, such as a memory die having a thickness of less than or equal to 3 mils, attached through the opening 30 to conductive features in the second front side metallization layer 24 by conductive connectors 126, such as C4 bumps. In FIG. 32, an underfill material 128 is dispensed and cured between the third die 124 and the front side of the package, such as between the third die 124 and the second front side metallization layer 24. In FIG. 33, the connectors 110 are probed by pins 130 of a probe card to test the structure. Known good packages can be used in further processing.

Figure 34:
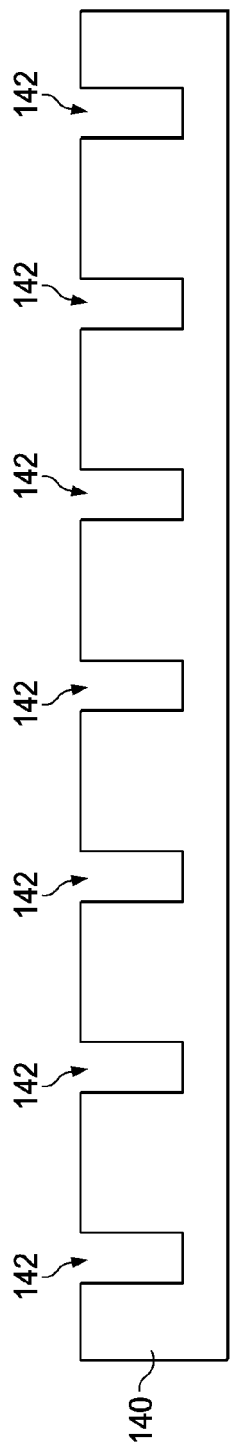

FIGS. 34 through 48 illustrate a method of forming an interposer and a die attached to the interposer. Referring to FIG. 34, a substrate 140 of an interposer is shown with through substrate via (TSV) recesses 142 formed through a front side of the substrate 140. The substrate 140 generally comprises a material similar to the substrate used to form a die that will be attached to the interposer, such as silicon. While the substrate 140 may be formed of other materials, it is believed that using silicon substrates for the interposer may reduce stress because the coefficient of thermal expansion (CTE) mismatch between the silicon substrates and the silicon typically used for the dies is lower than with substrates formed of different materials. The TSV recesses 142 are formed by, for example, etching, milling, laser techniques, a combination thereof, and/or the like.

Figure 35:
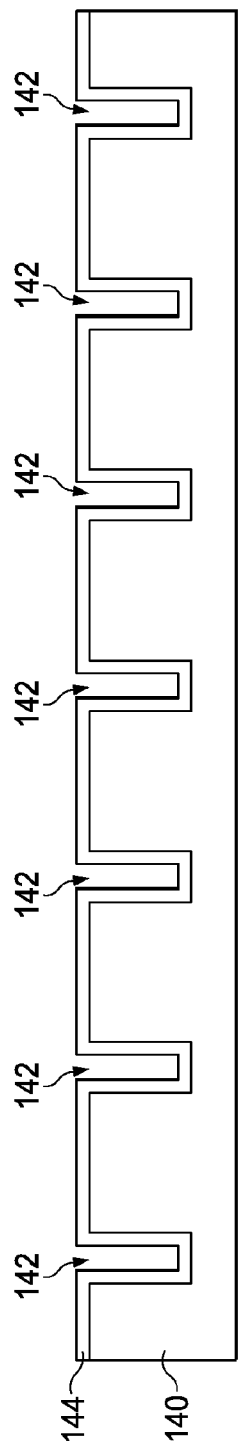

FIG. 35 shows the formation of an isolation layer 144 over the front surface of the substrate 140 and in the recesses 142. The isolation layer 144 can be, for example, silicon oxide, silicon nitride, the like, or a combination thereof. The isolation layer 144 can be formed by, for example, a chemical vapor deposition (CVD) process, a thermal oxidation process, an atomic layer deposition process (ALD), the like, or a combination thereof.

Figure 36:
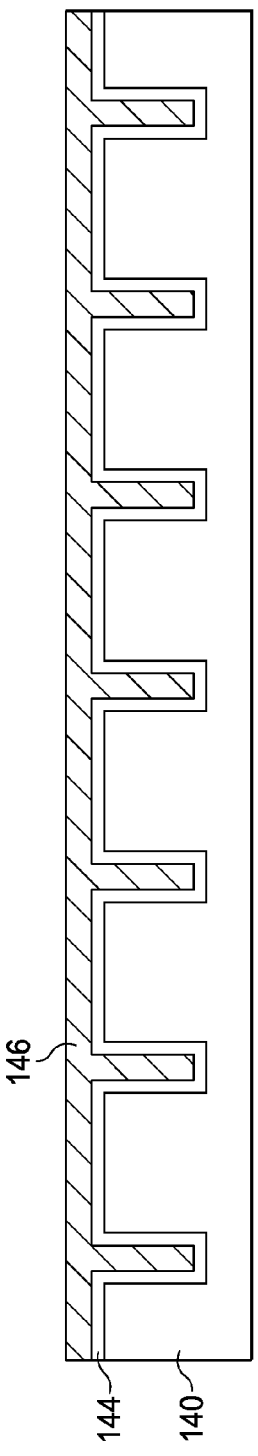

FIG. 36 shows the deposition of a conductive material 146. A seed layer is deposited over the front surface of the substrate 140 and in the recesses 142. The seed layer can be copper, titanium, the like, or a combination thereof, and can be deposited by sputtering, another PVD process, the like, or a combination thereof. The conductive material 146, such as copper, aluminum, tungsten, silver, gold, the like or a combination thereof, is deposited over the seed layer using, for example, electroplating, electroless plating, the like, or a combination thereof.

Figure 37:
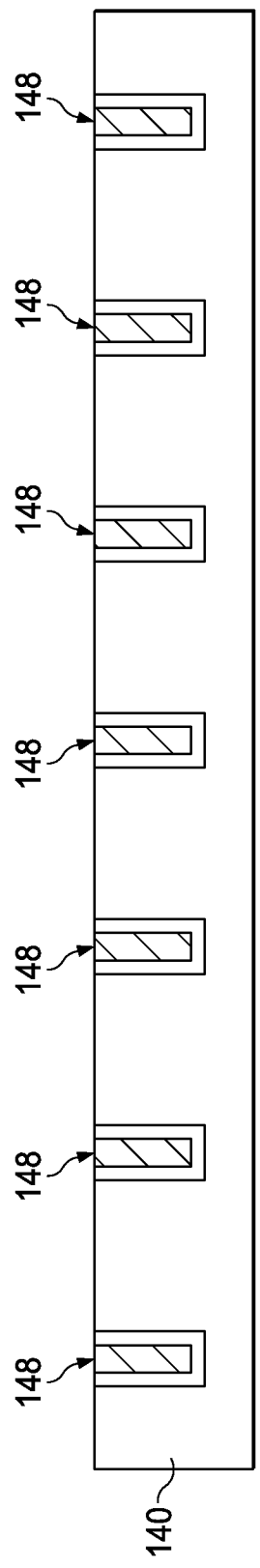

In FIG. 37, excess conductive material 146 and isolation layer 144 is removed from the front side of the substrate 140 by, for example, (CMP). Thus, the TSVs 148 comprise a conductive material and an isolation layer between the conductive material and the substrate 140.

Figure 38:
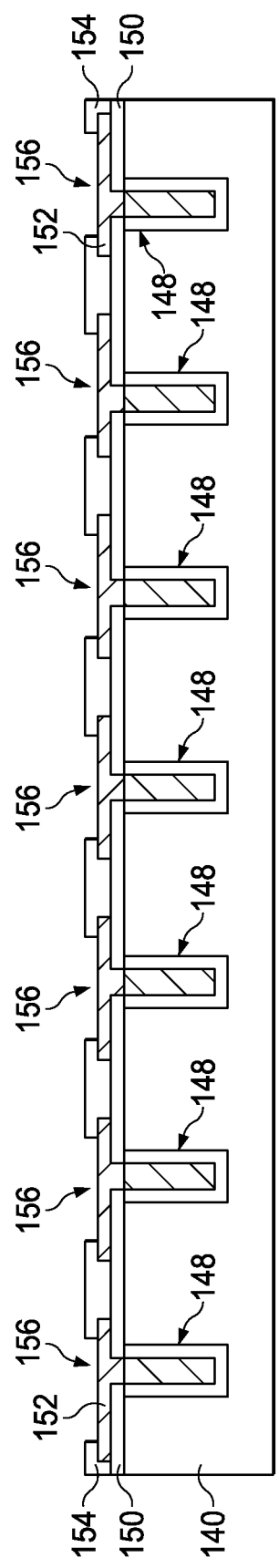

Front side processing continues in FIG. 38 with the formation of a front side RDL. The RDL may comprise any number or combination of metallization layers, ILD layers, vias, and passivation layers. The RDL depicted in FIG. 38 comprises one front side metallization layer 152 and two ILD layers 150 and 154. A first ILD layer 150 is deposited on the front side of the substrate 140. The first ILD layer 150 may be a polyimide, PBO, BCB, silicon oxide, the like, or a combination thereof. The first ILD layer 150 can be deposited by a coating process, a lamination process, a CVD process, the like, or a combination thereof. Openings may be formed through the first ILD layer 150 to the TSVs 148 using acceptable photolithography techniques and/or etching. A seed layer, such as a copper, titanium, or the like, is deposited on the first ILD layer 150 and in the openings to the TSVs 148, such as by sputtering or another physical vapor deposition (PVD) process. A photo resist is deposited on the seed layer and patterned to expose portions of the seed layer by photolithography. The pattern is of a first metallization layer on the front side. Conductive material of the first metallization layer 152, such as copper, aluminum, nickel, copper aluminum, tungsten, titanium, the like, or a combination thereof, is deposited on the exposed seed layer, such as by electroless plating, electroplating, or the like. The photoresist is removed by an ash and/or flush process. The exposed seed layer removed, such as by a wet or dry etch. The remaining conductive material forms the first front side metallization layer 152, portions of which are electrically coupled to the TSVs 148. A second ILD layer 154 is deposited on the first ILD layer 150 and over the first metallization layer 152. The second ILD layer 154 may be a polyimide, PBO, BCB, silicon oxide, the like, or a combination thereof. The second ILD layer 154 can be deposited by a coating process, a lamination process, a CVD process, the like, or a combination thereof. Openings 156 may be formed through the second ILD layer 154 to the first metallization layer 152 using acceptable photolithography techniques and/or etching techniques.

Figure 39:
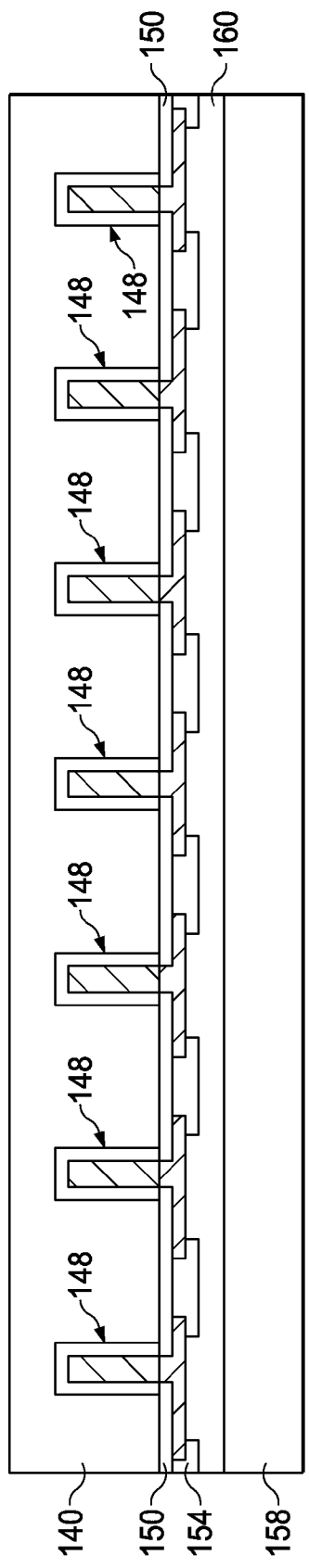

In FIG. 39, the front side of the structure in FIG. 38 is then attached to a carrier substrate 158 by an adhesive 160. The carrier substrate 158 may comprise, for example, glass, silicon oxide, aluminum oxide, a combination thereof, and/or the like. The adhesive 160 may be any suitable adhesive, such as UV glue.

Figure 40:
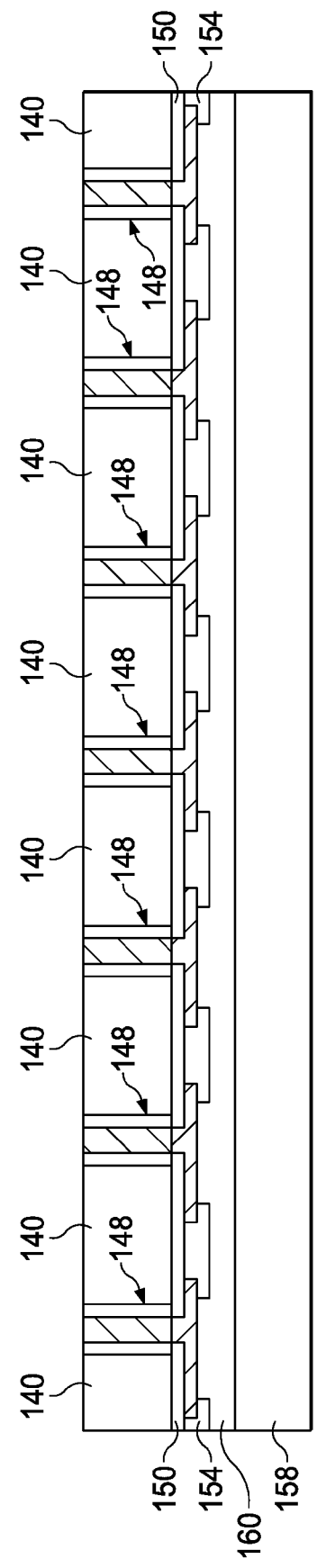

Back side processing begins as shown in FIG. 40. In FIG. 40, the back side of the substrate 140 is ground and/or polished, such as by CMP, and/or etched to expose the TSVs 148 on the back side of the substrate 140 by thinning the substrate 140. In FIG. 41, a first ILD layer 162, a metallization layer 164, and a second ILD layer 166 are formed the same as or similar to corresponding components discussed with respect to the front side of the substrate 140 in FIG. 38. Any number of ILD layer and metallization layers may be formed. Openings 168 and 170 are formed through the second ILD layer 166 using acceptable photolithography techniques and/or etching techniques.

In FIG. 42, the metallization layer 164 on the back side is probed by pins 172 of a probe card through the openings 168 and 170 for testing. Known good interposers can be used for further processing.

Figure 43:
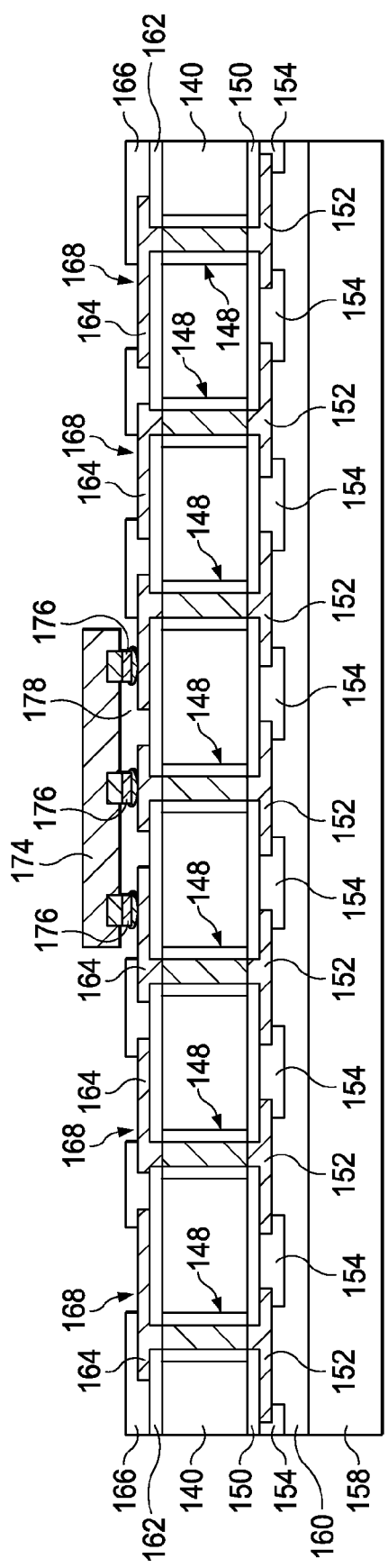
Figure 44:
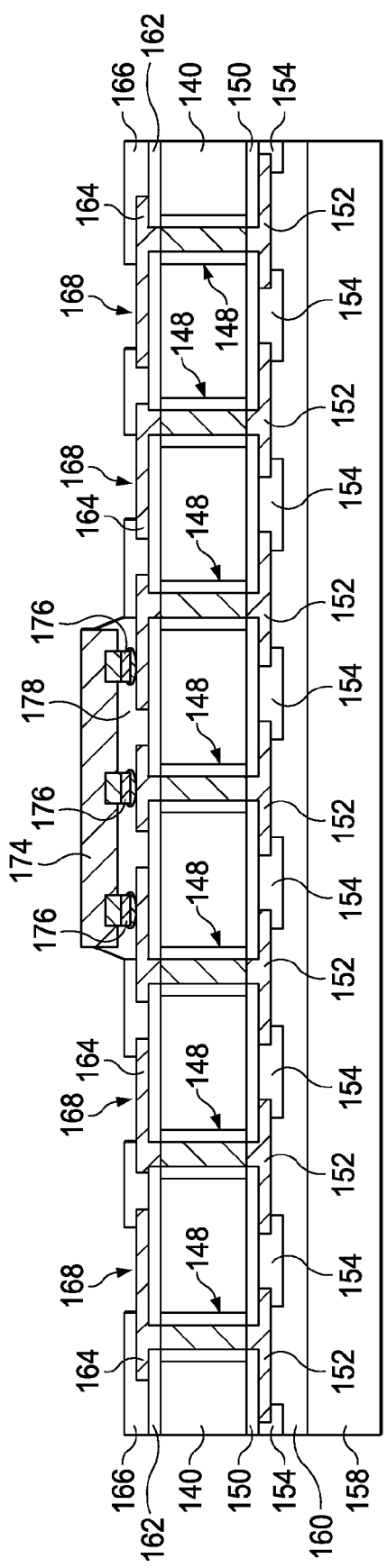
Figures 45, 46:
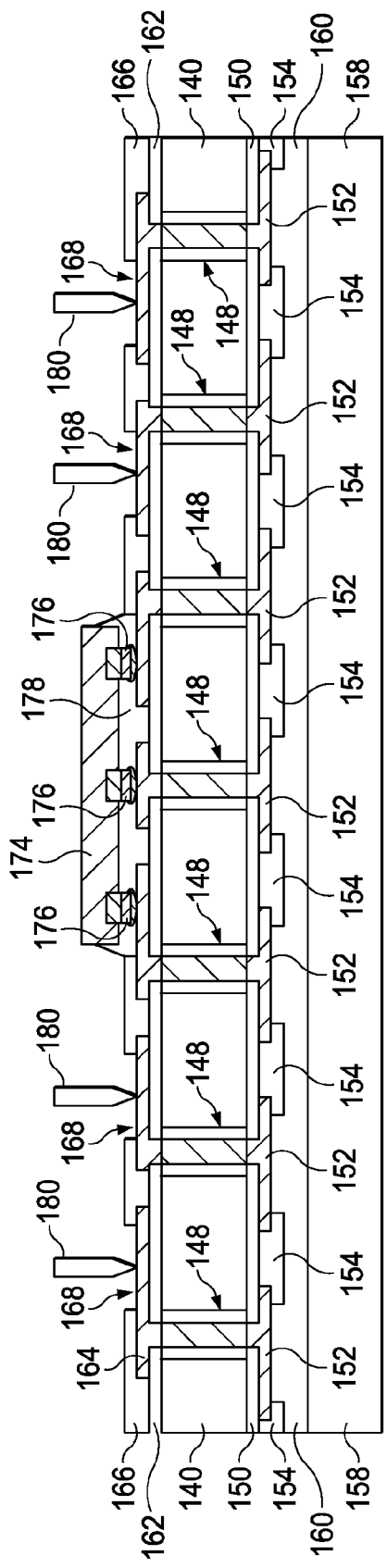

In FIG. 43, a die 174, such as a logic circuitry die, is attached through the opening 170 by the conductive connectors 176, such as C4 bumps. The die 174 may be known good dies attached using a pick-and-place tool, and the conductive connectors 176 may be reflowed. The connectors 176 are attached to conductive features in the back side metallization layer 164, and thus, the die 174 uses BOT technology. In FIG. 44, an underfill material 178 is dispensed and cured between the die 174 and the interposer, for example, the back side metallization layer 164. The underfill material 178 may be a liquid epoxy, deformable gel, silicon rubber, a combination thereof, and/or the like dispensed using acceptable dispensing equipment. In FIG. 45, the back side metallization layer 164 is probed through openings 168 by pins 180 of a probe card for testing. Known good dies and interposers can be used for further processing.

Figure 47:
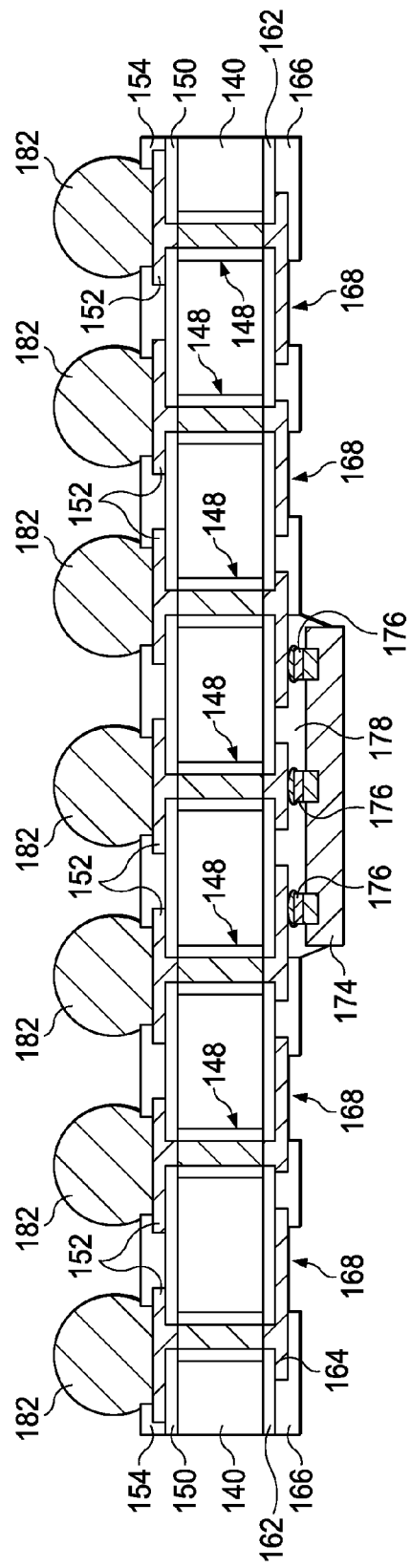
Figure 48:
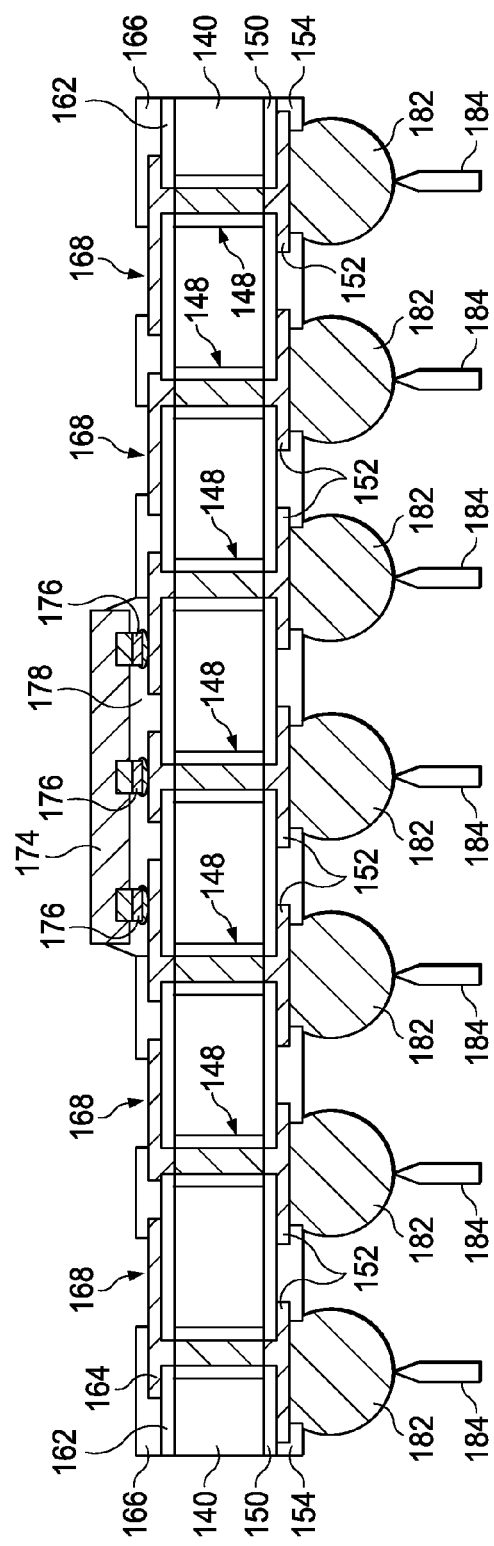

FIG. 46 shows the de-bonding of the front side of the interposer from the carrier substrate 158 and singulation of individual interposers. The de-bonding from the carrier substrate 158 may comprise exposing the adhesive 160 to UV lights, such as a laser, or by exposing the adhesive 160 to a solvent. FIG. 47 illustrates the formation of conductive connectors 182, such as BGA balls, on the front side of the interposer. Bond pads may be formed in the openings 156 on the front side of the interposer, and connectors 182 may be formed on the bond pads. The connectors may be a lead-free solder. In FIG. 48, the connectors 182 are probed by pins 184 of a probe card to test the structure. Known good interposers and dies can be used in further processing.

Figure 49A:
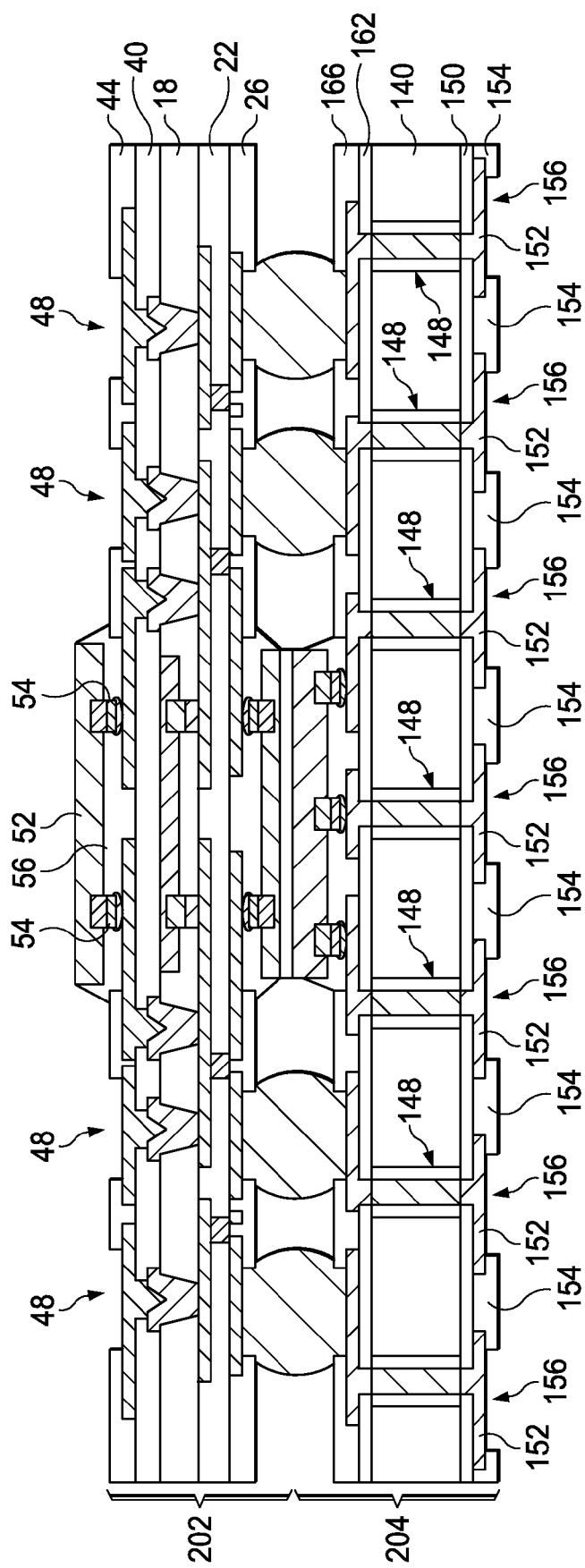
FIGS. 49A and 49B are example package-on-package (PoP) structures according to embodiments.
Figure 49B:
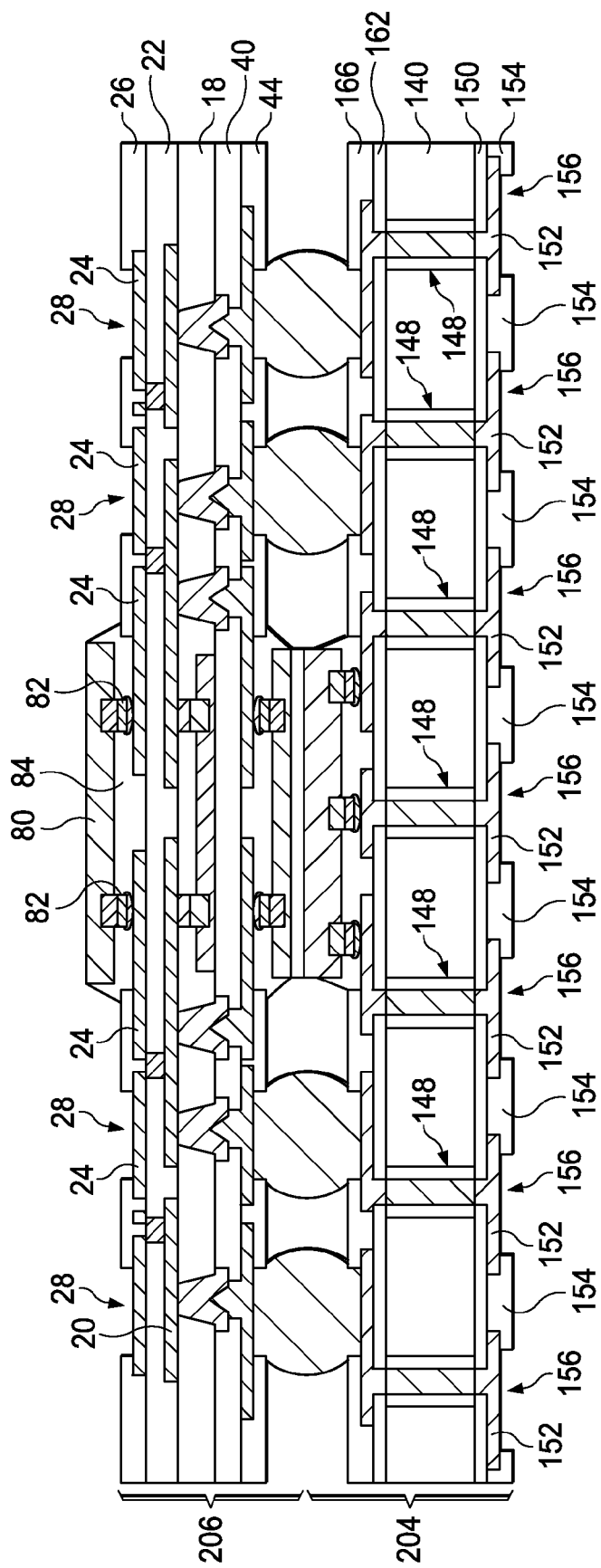

In FIGS. 49A and 49B, packages are stacked to form the PoP structure. In FIG. 49A, a package 202 comprising a first die encased in molding compound, a second die on a back side of the package, and a third die on a front side of the package is stacked on an interposer package 204 comprising a die on a top surface of an interposer. The package 202 can be the package formed in FIG. 17, and the interposer package 204 can be the package formed in FIG. 48. In FIG. 49B, a package 206 comprising a first die encased in molding compound, a second die on a front side of the package, and a third die on a back side of the package is stacked on an interposer package 204 comprising a die on a top surface of an interposer. The package 202 can be the package formed in FIGS. 24 and 33, and the interposer package 204 can be the package formed in FIG. 48. In FIGS. 49A and 49B, the package 202 and 206, respectively, is attached to the interposer package 204 with conductive connectors, such as BGA balls, coupling a metallization layer on a back side of the interposer. The conductive connectors are then reflowed to more permanently attach the packages.

Figure 50:
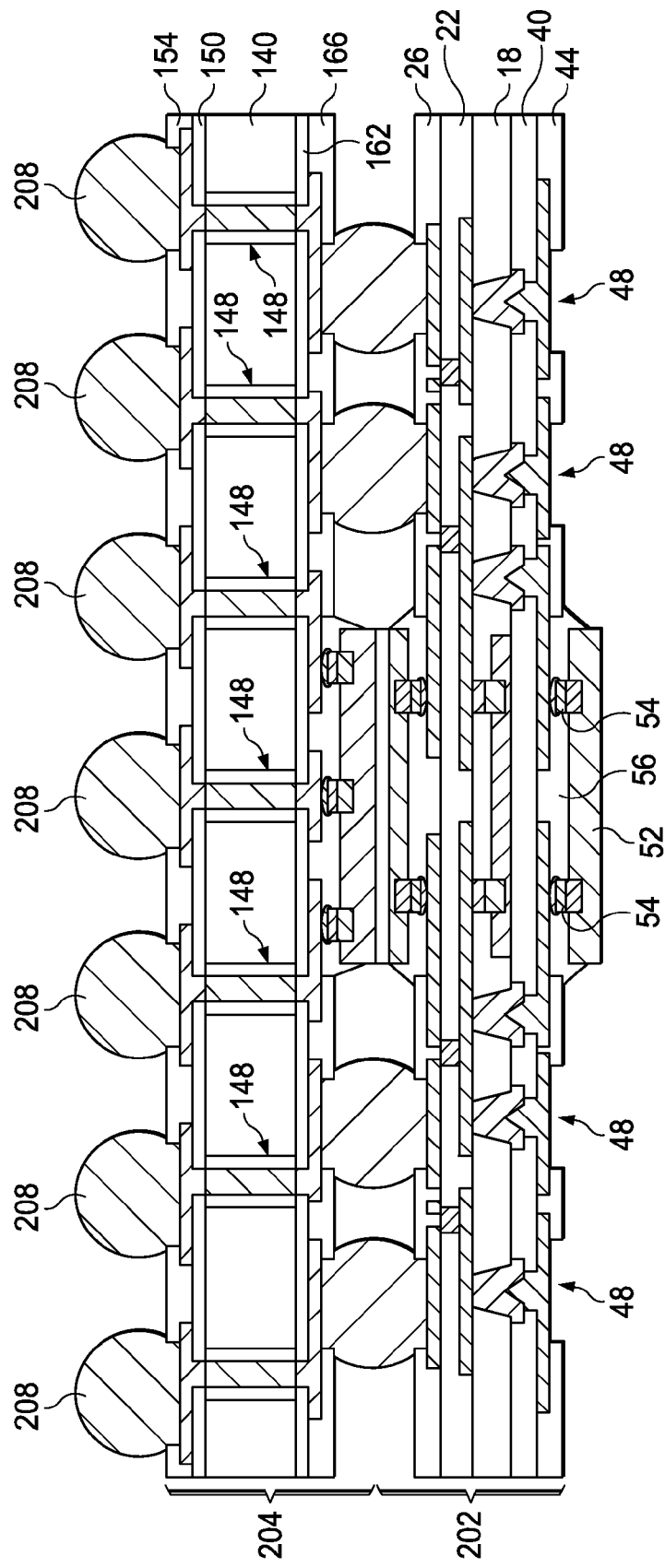
FIG. 50 is a step to form electrical connectors on the PoP structure of FIG. 49A according to an embodiment.

In FIG. 50, the PoP structure of FIG. 49A, for example, has conductive connectors 208, such as BGA balls, formed coupled to a metallization layer on a front side of the interposer of the interposer package 204. The connectors 208 may be formed before the packages 202 and 204 are stacked, such as described in FIG. 13, or after the packages 202 and 204 are stacked, as shown in FIG. 50. Further, the PoP structure of 49B can similarly have conductive connectors formed, although not explicitly depicted.

Figure 51:
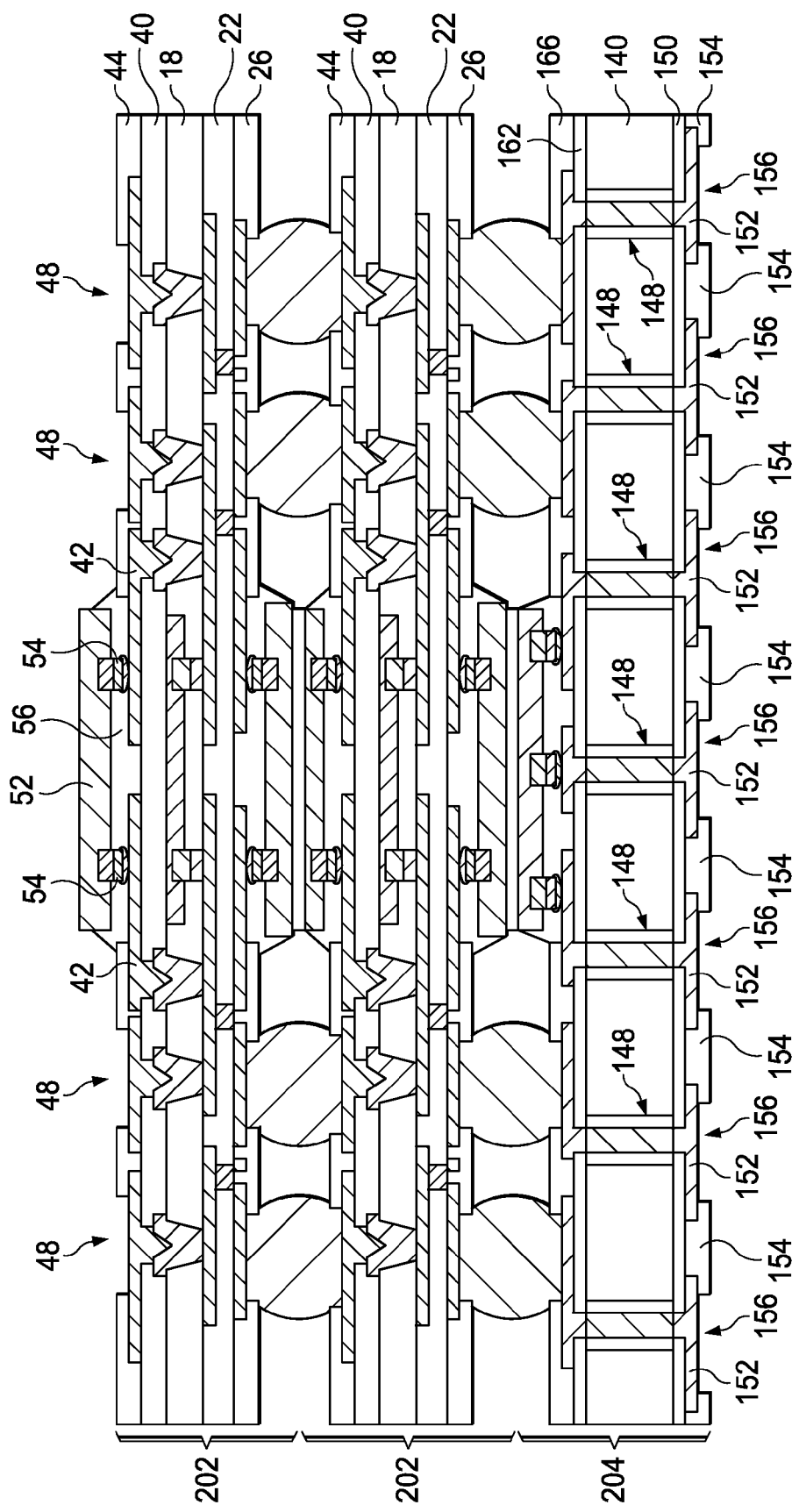
FIG. 51 is another example PoP structure according to an embodiment.
Figure 52:
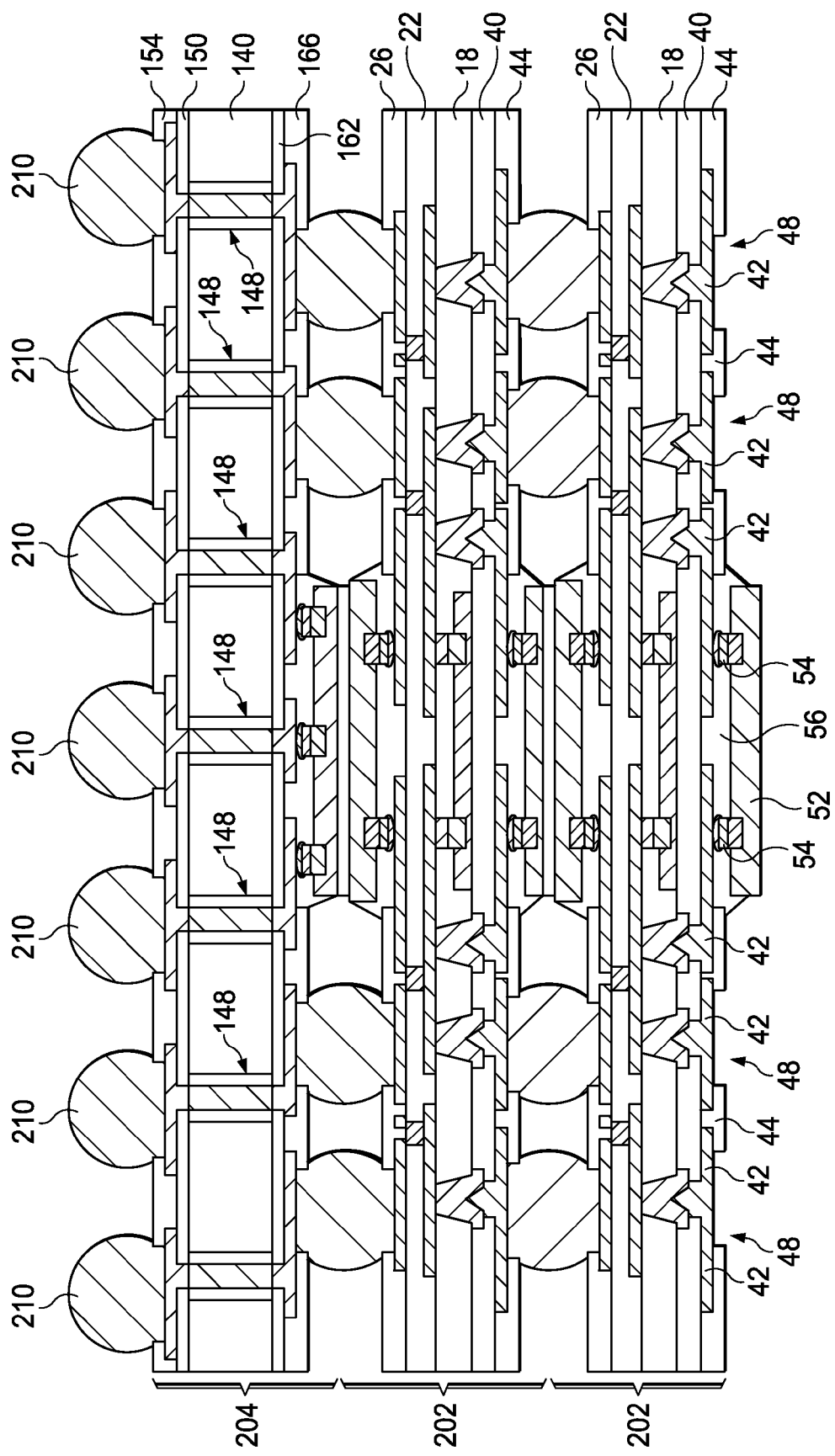
FIG. 52 a step to form electrical connectors on the PoP structure of FIG. 51 according to an embodiment.

FIG. 51 shows that multiple packages 202 (or packages 206) can be stacked in the PoP structure. In FIG. 52, connectors 210, such as BGA balls, formed coupled to a metallization layer on a front side of the interposer of the interposer package 204, similar to FIG. 50.

Figure 53:
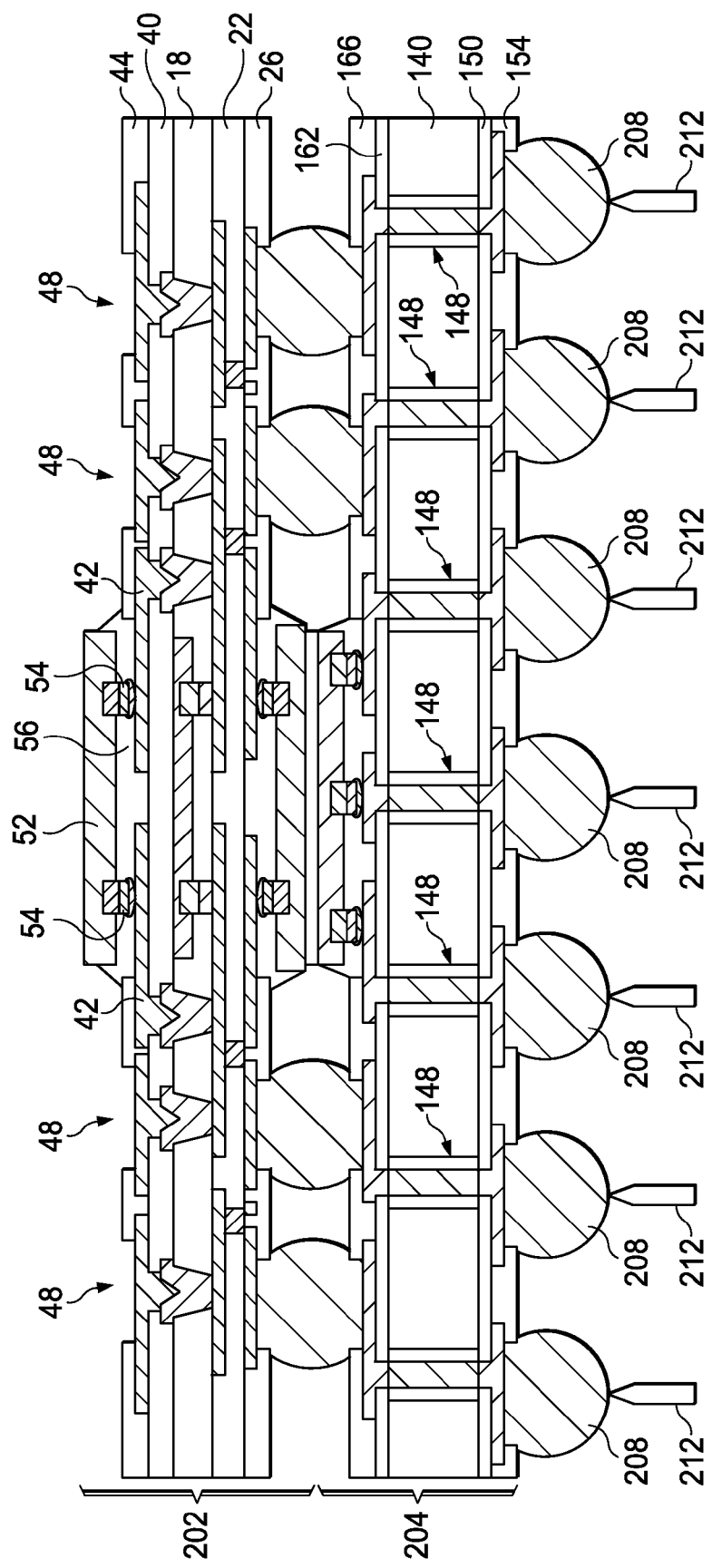
FIG. 53 is a step to test the PoP structure of FIG. 50 according to an embodiment.
Figure 54:
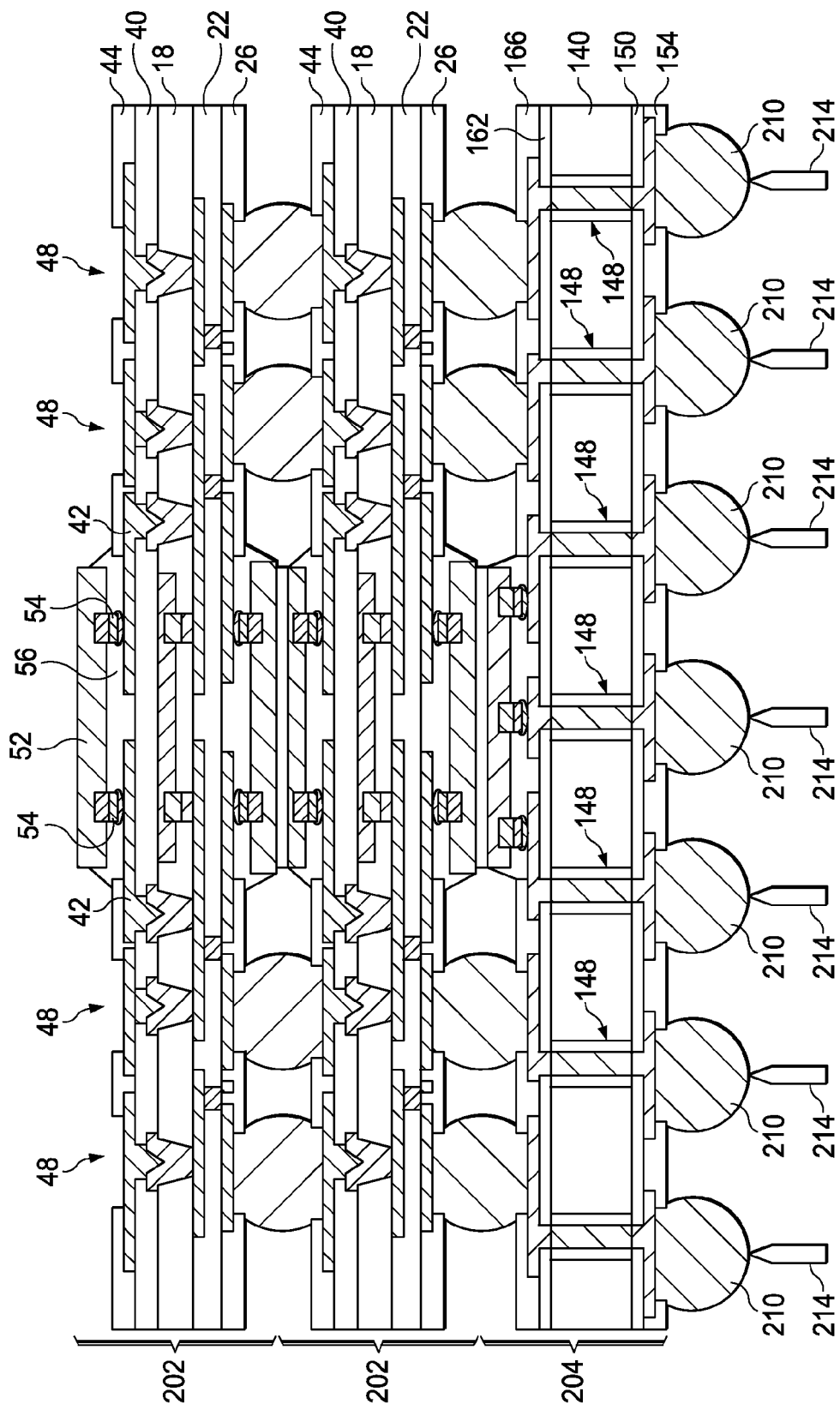
FIG. 54 is a step to test the PoP structure of FIG. 52 according to an embodiment.

In FIGS. 53 and 54, the PoP structures of FIGS. 50 and 52 have connectors 208 and 210 probed by pins 212 and 214 of a probe card for testing the PoP structures, respectively.

Embodiments may achieve a more efficient use of space by placing a die within a substrate of a package. By placing the die within the substrate of a package, another substrate may not be required to have the die on a surface.

An embodiment is a package-on-package (PoP) structure. The structure comprises a first package and a second package. The first package comprises a first die, a second die, and a first core material. The first core material has a first surface and a second surface opposite the first surface. A first redistribution layer (RDL) is on the first surface of the first core material, and a second RDL is on the second surface of the first core material. The first die is disposed in the first core material between the first surface of the first core material and the second surface of the first core material. The second die is coupled to one of the first RDL and the second RDL. The second package comprises a third die and an interposer. The interposer has a first side and a second side opposite the first side. The third die is coupled to the second side of the interposer. The first package is coupled to the second package by first electrical connectors coupled to the second side of the interposer and the first RDL.

Another embodiment is a PoP structure. The structure comprises an interposer, a first die, a first substrate comprising a second die, and a third die. The interposer has a first side and a second side opposite the first side. The first die is on the second side of the interposer. The first substrate is on and coupled to the second side of the interposer by first electrical connectors. The first substrate comprises a first core material, a first RDL, the second die, and a second RDL. The first core material has a first surface and a second surface. The first RDL is on the first surface of the first core material, and the first RDL is coupled to the first electrical connectors. The second die is disposed in the first core material between the first surface of the first core material and the second surface of the first core material. The second RDL is on the second surface of the first core material. The third die is on the first substrate.

Figure 55A:
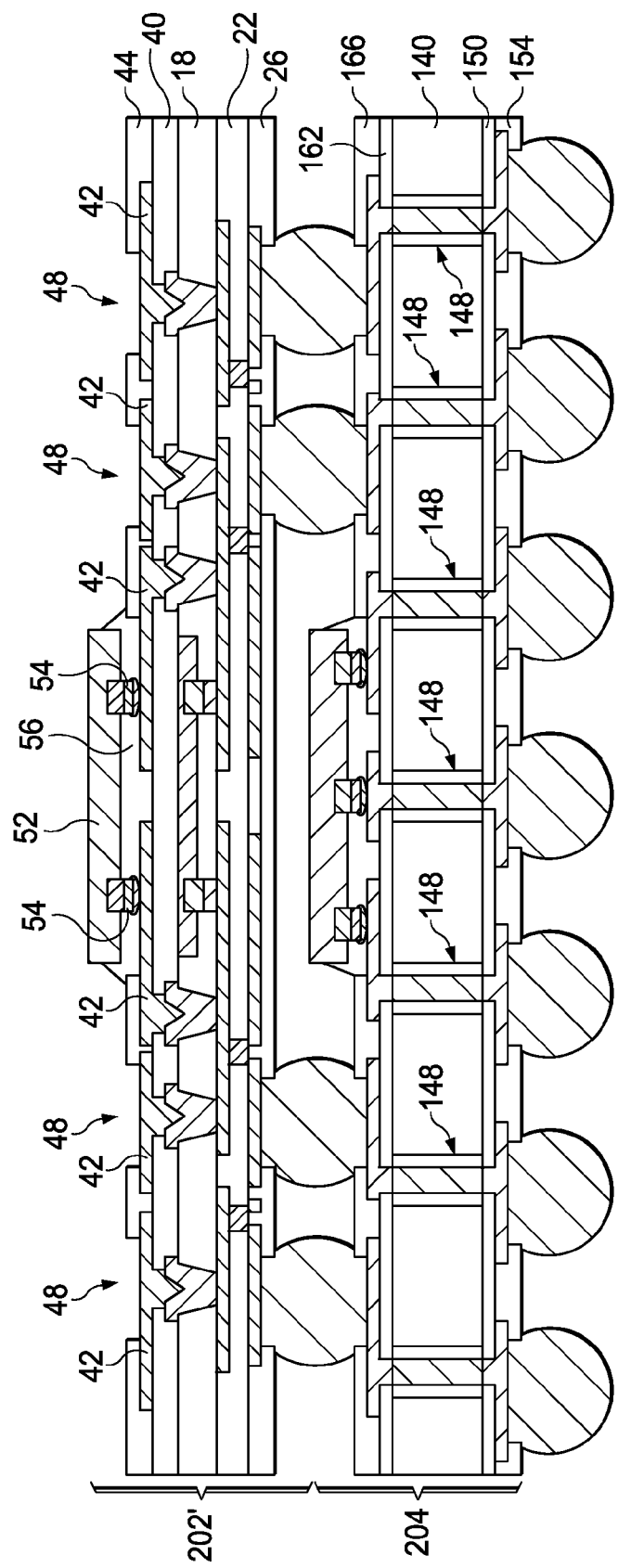
FIGS. 55A and 55B are further examples of PoP structures according to embodiments.
Figure 55B:
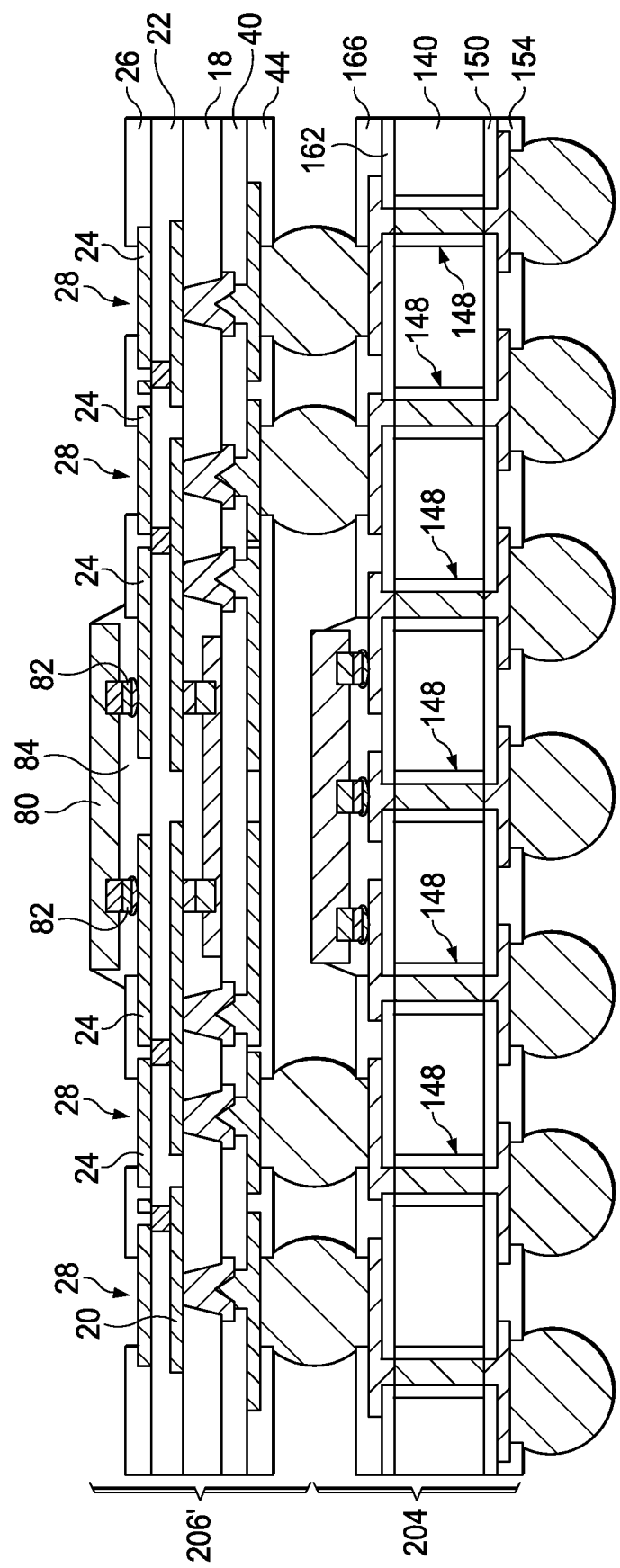

A further embodiment is a method for forming a PoP structure. The method comprises applying a first molding compound on a first die, first electrical connectors electrically coupled to the first die being exposed through a first surface of the first molding compound; forming a first redistribution layer (RDL) on the first surface of the first molding compound, the first RDL on the first molding compound being electrically coupled to the first electrical connectors; forming a second RDL on a second surface of the first molding compound; attaching a second die to one of the first RDL on the first molding compound and the second RDL on the first molding compound; and attaching second electrical connectors to one of the first RDL on the first molding compound and the second RDL on the first molding compound and to a first side of an interposer, the interposer having a third die on the first side of the interposer Although the present embodiments and their advantages have been described in detail, it should be understood that various changes, substitutions and alterations can be made herein without departing from the spirit and scope of the disclosure as defined by the appended claims. For example, some of the steps and components of PoP structures depicted herein may be omitted. FIGS. 55A and 55B show examples. The modified packages 202' and 206' comprise one less die that the packages 202 and 206 in FIGS. 49A and 49B, respectively. A person having ordinary skill in the art will readily understand how to achieve this PoP structure based on this disclosure, and thus, further explicit description is omitted for brevity.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
applying a first molding compound on a first die, first electrical connectors electrically coupled to the first die being exposed through and having respective surfaces co-planar with a first surface of the first molding compound;
forming a first redistribution layer (RDL) on the first surface of the first molding compound, the first RDL on the first molding compound being electrically coupled to the first electrical connectors;
forming a second RDL on a second surface of the first molding compound;
attaching a second die to the first RDL on the first molding compound; and
attaching second electrical connectors to the first RDL on the first molding compound and to a first side of an interposer, the interposer having a third die on the first side of the interposer.

2. The method of claim 1, further comprising attaching a fourth die to the second RDL on the first molding compound.

3. The method of claim 1, further comprising forming through vias extending from the first surface of the first molding compound to the second surface of the first molding compound, the through vias electrically coupling the first RDL on the first molding compound and the second RDL on the first molding compound.

4. The method of claim 1 further comprising:
applying a second molding compound on a fourth die, third electrical connectors electrically coupled to the fourth die being exposed through a first surface of the second molding compound;
forming a first redistribution layer (RDL) on the first surface of the second molding compound, the first RDL on the second molding compound being electrically coupled to the third electrical connectors;
forming a second RDL on a second surface of the second molding compound;
attaching a fifth die to one of the first RDL on the second molding compound and the second RDL on the second molding compound; and
attaching fourth electrical connectors to one of the first RDL on the second molding compound and the second RDL on the second molding compound and to the second RDL on the first molding compound.

5. The method of claim 1, further comprising applying a thermal interface material, the thermal interface material being disposed between the second die and the third die.

6. The method of claim 5, wherein the thermal interface material is applied after the second electrical connectors are attached to the first side of the interposer.

7. The method of claim 1, wherein the interposer comprises a semiconductor substrate having through substrate vias through the semiconductor substrate, a first metallization being on a first side of the semiconductor substrate, a second metallization being on a second side of the semiconductor substrate, and through substrate vias electrically coupling the first metallization to the second metallization.

8. A method comprising:
encapsulating a first die in a first molding compound, the first die having first conductive pillars on an active side of the first die;
planarizing the first molding compound to have a first surface co-planar with respective surfaces of the first conductive pillars distal from the first die, the first molding compound further having a second surface opposite from the first surface;
forming a first redistribution layer (RDL) on the first surface of the first molding compound;
forming a second RDL on the second surface of the first molding compound;

mechanically and electrically attaching a second die to the second RDL using first conductive bumps;

forming an interposer having a first metallization on a first side and a second metallization on a second side, the first side being opposite from the second side;

mechanically and electrically attaching a third die to the first metallization of the interposer using second conductive bumps; and mechanically and electrically attaching the first metallization of the interposer to the first RDL using first external electrical connectors, the second die being on a side of the first molding compound distal from the interposer.

9. The method of claim 8 further comprising mechanically and electrically attaching a fourth die to the first RDL using third conductive bumps, the fourth die being on a side of the first molding compound opposite from the second die.

10. The method of claim 9 further comprising applying a thermal interface material, the thermal interface material being disposed between the third die and the fourth die after the first metallization of the interposer is mechanically and electrically attached to the first RDL.

11. The method of claim 8, wherein the first metallization of the interposer is mechanically and electrically attached to the first RDL using the first external electrical connectors.

12. The method of claim 8, wherein the interposer comprises a semiconductor substrate having through substrate vias through the semiconductor substrate, the first metallization being on a first side of the semiconductor substrate, the second metallization being on a second side of the semiconductor substrate, the through substrate vias electrically coupling the first metallization to the second metallization.

13. The method of claim 8 further comprising:
encapsulating a fourth die in a second molding compound, the fourth die having second conductive pillars on an active side of the fourth die;

planarizing the second molding compound to have a third surface co-planar with respective surfaces of the second conductive pillars distal from the fourth die, the second molding compound further having a fourth surface opposite from the third surface;

forming a third RDL on the third surface of the second molding compound;

forming a fourth RDL on the fourth surface of the second molding compound;

mechanically and electrically attaching a fifth die to the third RDL or the fourth RDL using third conductive bumps;

mechanically and electrically attaching the third RDL or the fourth RDL to the second RDL using second external electrical connectors, the second external electrical connectors being mechanically and electrically attached to the second RDL.

14. The method of claim 13 further comprising mechanically and electrically attaching a sixth die to the third RDL or the fourth RDL using fourth conductive bumps, the sixth die being disposed between the first molding compound and the second molding compound after mechanically and electrically attaching the third RDL or the fourth RDL to the second RDL.

15. The method of claim 13, wherein the third RDL is mechanically and electrically attached to the second RDL using the second external electrical connectors, and the fifth die is mechanically and electrically attached to the fourth RDL using the third conductive bumps.

16. The method of claim 13, wherein the fourth RDL is mechanically and electrically attached to the second RDL using the second external electrical connectors, and the fifth die is mechanically and electrically attached to the third RDL using the third conductive bumps.

17. A method comprising:
forming a first package comprising:
    forming through substrate vias through a semiconductor substrate,
    forming a first metallization on a first side of the semiconductor substrate,
    forming a second metallization on a second side of the semiconductor substrate, the through substrate vias electrically coupling the first metallization to the second metallization, and
    attaching a first die to the first metallization using first conductive bumps;
forming a second package comprising:
    encapsulating a second die in a first molding compound, the second die having first conductive pillars on an active side of the second die,
    planarizing the first molding compound to have a first surface co-planar with respective surfaces of the first conductive pillars, the first molding compound having a second surface opposite from the first surface,
    forming a first redistribution layer (RDL) on the first surface of the first molding compound,
    forming through molding vias through the first molding compound,
    forming a second RDL on the second surface of the first molding compound opposite from the first RDL,
    attaching a third die to the first RDL using second conductive bumps, and
    attaching a fourth die to the second RDL using third conductive bumps; and
    attaching the first metallization to the first RDL using first external connectors.

18. The method of claim 17, further comprising applying a thermal interface material, the thermal interface material being disposed between the first die and the third die.

19. The method of claim 17, further comprising forming a third package, and attaching the third package to the second RDL using second external connectors.

20. The method of claim 19, wherein the third package comprises a second molding compound, a first RDL on a first side of the second molding compound and a second RDL on a second side of the second molding compound.

* * * * *